(12) United States Patent
Chang et al.

(10) Patent No.: US 12,218,296 B2
(45) Date of Patent: Feb. 4, 2025

(54) DISPLAY SCREEN AND DISPLAYING DEVICE HAVING THE SAME

(71) Applicants: Henan Fuchi Technology Co., Ltd., Zhengzhou (CN); HON HAI PRECISION INDUSTRY CO., LTD., New Taipei (TW)

(72) Inventors: Hsi-Che Chang, New Taipei (TW); Jin-Lu Li, Zhengzhou (CN); Bo Chen, Zhengzhou (CN)

(73) Assignees: Henan Fuchi Technology Co., Ltd., Zhengzhou (CN); HON HAI PRECISION INDUSTRY CO., LTD., New Taipei (TW)

( * ) Notice: Subject to any disclaimer, the term of this patent is extended or adjusted under 35 U.S.C. 154(b) by 543 days.

(21) Appl. No.: 17/564,527

(22) Filed: Dec. 29, 2021

(65) Prior Publication Data
US 2022/0320396 A1 Oct. 6, 2022

(30) Foreign Application Priority Data
Mar. 30, 2021 (CN) .......................... 202120643427.9

(51) Int. Cl.
*H01L 33/62* (2010.01)
*H01L 25/075* (2006.01)
(Continued)

(52) U.S. Cl.
CPC .......... *H01L 33/62* (2013.01); *H01L 25/0753* (2013.01); *H01L 33/38* (2013.01); *H01L 33/486* (2013.01)

(58) Field of Classification Search
CPC ..... H01L 33/62; H01L 25/0753; H01L 33/38; H01L 33/486
See application file for complete search history.

(56) References Cited

U.S. PATENT DOCUMENTS

| 2018/0190184 A1* | 7/2018 | Kim | G09G 3/32 |
| 2020/0161281 A1* | 5/2020 | Hong | H01L 25/0753 |
| 2022/0157793 A1* | 5/2022 | Liao | H01L 25/167 |

FOREIGN PATENT DOCUMENTS

| CN | 204464314 | * | 7/2015 |
| CN | 208970508 U | | 6/2019 |

(Continued)

OTHER PUBLICATIONS

Machine translation of CN 204464314 (Year: 2015).*
Machine translation of CN 113571627 (Year: 2021).*

*Primary Examiner* — Yasser A Abdelaziez
(74) *Attorney, Agent, or Firm* — ScienBiziP, P.C.

(57) ABSTRACT

A display screen allowing higher pixel density and thus better screen resolution by virtue of the structures connecting to LED chip light sources includes a substrate, a number of pad structures, the LED chips, and a number of carrier boards. Each pad structure includes a positive electrode pad and three negative electrode pads. Each LED chip package includes a red light chip, a green light chip, and a blue light chip arranged on the three negative electrode pads. Each carrier board includes a positive electrode connection terminal and a negative electrode connection terminal, the positive electrode connection terminal is electrically connected to the positive electrode pad, the negative electrode connection terminal is electrically connected to one red light chip, one green light chip, or one blue light chip. The disclosure also provides a displaying device having the display screen.

20 Claims, 21 Drawing Sheets

(51) Int. Cl.
    *H01L 33/38*          (2010.01)
    *H01L 33/48*          (2010.01)

(56)           References Cited

FOREIGN PATENT DOCUMENTS

| CN | 113571627 | * | 10/2021 |
|---|---|---|---|
| WO | WO-2020035373 | * | 2/2020 |

* cited by examiner

DISPLAY SCREEN AND DISPLAYING DEVICE HAVING THE SAME

FIELD

The subject matter herein generally relates to display technology, especially relates to display screens.

BACKGROUND

LED displays have a R (red) chip, a G (green) chip, and a B (blue) chip. The R-chip, the G-chip, and the B-chip are three-in-one packages of LED lamp beads to achieve full-color display. Each LED lamp bead constitutes a pixel point of the LED display screen, and the arrangement of multiple LEDs forms the full-color display of the display screen.

When the distance between adjacent LED lamp beads on the circuit board of the LED display is larger, the resolution of the LED display screen is lower. Conversely, when the distance between adjacent LED lamp beads on the circuit board of the LED display is smaller, the resolution of the LED display screen is higher. In generally, each LED lamp bead is electrically connected to three positive electrode pads on a PCB lamp board. A large space between adjacent positive electrode pads means that the overall area of the three positive electrode pads is large. After the R-chip, G-chip, and B-chip are connected, the overall size of the structure formed by the positive electrode pad and the LED lamp bead is large, so that the dot density per unit area of the pixels on the circuit board is smaller, which affects the resolution of the display screen. The size of each positive electrode pad being smaller would create difficulties in bonding with each chip, resulting in a low yield because of bonding failures.

Therefore, there is room for improvement within the prior art.

BRIEF DESCRIPTION OF THE DRAWINGS

Implementations of the present technology will now be described, by way of embodiments with reference to the attached figures.

DETAILED DESCRIPTION

Figure 1:
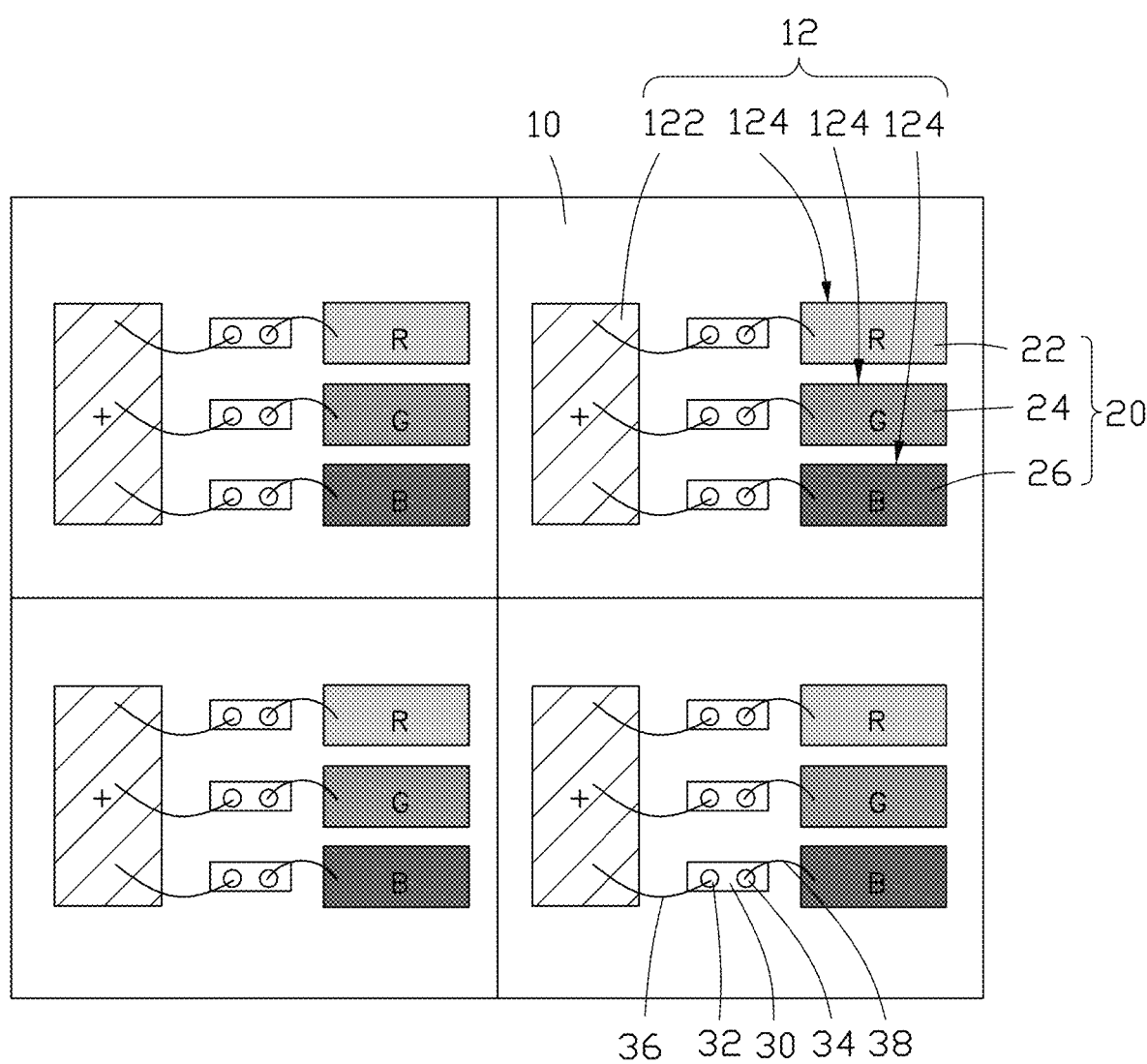
FIG. 1 is a schematic structural diagram of a display screen provided by a first embodiment of the present application.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain parts may be exaggerated to better show details and features of the present disclosure. The disclosure is by way of embodiments and not by way of limitation in the figures of the accompanying drawings, in which like references indicate similar elements. It should be noted that references to "an" or "one" embodiment in this disclosure are not necessarily to the same embodiment, and such references mean "at least one."

Several definitions that apply throughout this disclosure will now be presented.

The term "substantially" is defined to be essentially conforming to the particular dimension, shape, or other feature that the term modifies, such that the component need not be exact. For example, "substantially cylindrical" means that the object resembles a cylinder, but can have one or more deviations from a true cylinder. The term "comprising," when utilized, means "including, but not necessarily limited to"; it specifically indicates open-ended inclusion or membership in the so-described combination, group, series, and the like. References to "a plurality of" and "a number of" mean "at least two."

Referring to FIG. 1, according to a first embodiment of the present application, a display screen 100 includes a substrate 10, a plurality of LED chips 20, and a plurality of carrier boards 30. It should be noted that, for ease of understanding, FIG. 1 shows only a part of the structure of the display screen 100.

A plurality of pad structures 12 is arranged on a surface of the substrate 10 in an array, and each pad structure 12 includes a positive electrode pad 122 and three negative electrode pads 124. The three negative electrode pads 124 are positioned on a side of the positive electrode pad 122 and arranged side by side. The three negative electrode pads 124 have same shape. Spaces between each negative electrode pad 124 and the positive electrode pad 122 are same.

It is understandable that in other embodiments, the three negative electrode pads 124 have different shapes. For example, the three negative electrode pads 124 are all rectangular, but the area of each shape can decrease or increase sequentially. Compared with the three negative electrode pads 124 with different shapes, the three negative electrode pads 124 with the same shape have higher connection stability after assembly and a better light emitting effect.

A driving circuit (not shown) is integrated in the substrate 10, and the driving circuit is electrically connected to the positive electrode pad 122 and the negative electrode pad 124. The substrate 10 can be a flexible printed circuit (FPC), a printed circuit board (PCB), and a rigid-flex circuit board.

In the embodiment, the plurality of pad structures 12 all have a first structure. The first structure is a structure in which the negative electrode pads 124 are arranged in the positive direction of the X-axis of the positive electrode pad 122, that is, the negative electrode pad 124 is arranged on the right side of the positive electrode pad 122. In the embodiment, the number of the pad structures 12 is four.

It is understandable that, in some embodiments, the positions of the negative electrode pad 124 and the positive electrode pad 122 are rotated clockwise or counterclockwise by a predetermined angle relative to the positions of the negative electrode pad 124 and the positive electrode pad 122 in the first structure. The predetermined angle can be, but is not limited to, 45 degrees or 135 degrees.

The LED chips 20 are arranged in a one-to-one correspondence with the pad structures 12, and each LED chip 20 includes a red light chip 22, a green light chip 24, and a blue light chip 26 arranged on the three negative electrode pads 124. The red light chip 22 is an R chip, the green light chip 24 is a G chip, and the blue light chip 26 is a B chip.

A plurality of carrier boards 30 is arranged to correspond with each red light chip 22, each green light chip 24 and each blue light chip 26. The carrier boards 30 are arranged between the positive electrode pad 122 and the red light chip 22, the green light chip 24, and the blue light chip 26, and each carrier board 30 has a positive connection terminal 32 and a negative connection terminal 34. The positive connection terminal 32 is electrically connected to the positive electrode pad 122 through the first gold wire 36, and the negative connection terminal 34 is electrically connected to red light chip 22, green light chip 24, or blue light chip 26 through the second gold wire 38. That is, there are three second gold wires 38. In the embodiment, the carrier board 30 is a silicon wafer.

The above-mentioned display screen 100 in the first embodiment is electrically connected to the red light chip 22, the green light chip 24, and the blue light chip 26 by the positive electrode pad 122. Compared with the overall area of the three positive electrode pads 122 in the prior art, the present disclosure only provides one positive electrode pad 122 having a smaller area and is less difficult to form, and the overall size of the structure formed by the positive electrode pad 122, the red light chip 22, the green light chip 24, and the blue light chip 26 is smaller, so that the dot density per unit area of the pixels on the substrate 10 is greater, thereby improving the resolution of the LED display screen. The greater size of the positive electrode pad 122 allows easier binding with each chip, thus making yield rate higher.

Figure 2:
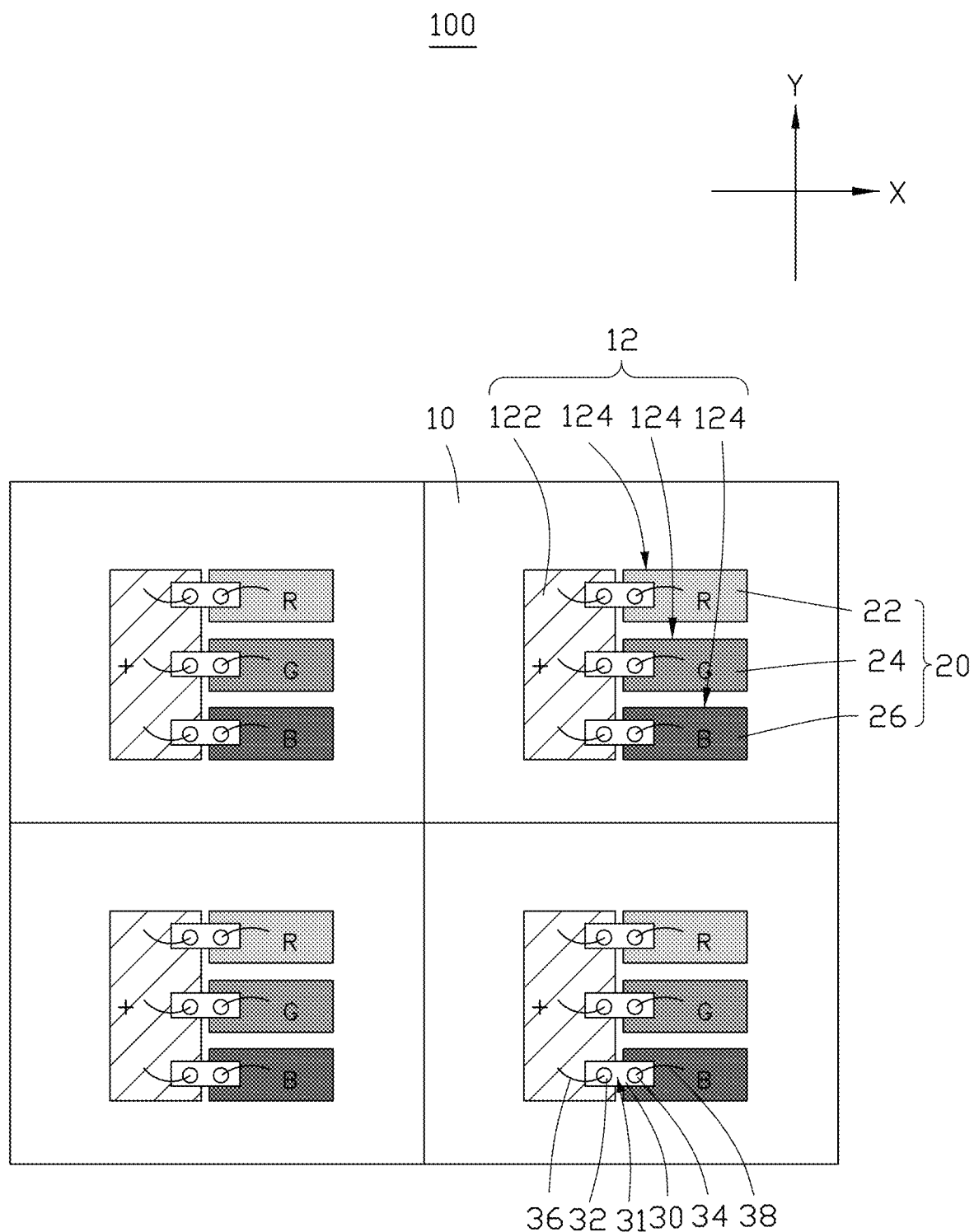
FIG. 2 is a schematic structural diagram of a display screen provided by a second embodiment of the present application.

Referring to FIG. 2, according to a second embodiment of the present disclosure, the structure of the display screen 100 is substantially the same as that of the display screen 100 in the first embodiment. The pad structures 12 are also of the first structure in which a plurality of negative electrode pads 124 are arranged in the positive direction of the X-axis of the positive electrode pad 122. The structure of the display screen 100 in the second embodiment and the display screen 100 in the first embodiment have the following differences.

In the second embodiment, the carrier board 30 has a first bearing surface 31 and a second bearing surface 33 (shown in FIG. 3) opposite to each other. The positive electrode connection terminal 32 and the negative electrode connection terminal 34 are both positioned on the first bearing surface 31, a first part of the second bearing surface 33 is arranged on the positive electrode pad 122, and a second part of the second bearing surface 33 is arranged on the red light chip 22, the green light chip 24, or the blue light chip 26.

The above-mentioned display screen 100 in the second embodiment is electrically connected to the red light chip 22, the green light chip 24, and the blue light chip 26 by the positive electrode pad 122. Compared with the overall area of the three positive electrode pads 122 in the prior art, the present disclosure only provides one positive electrode pad 122 having a smaller area and being less difficult to form, and the overall size of the structure formed by the positive electrode pad 122, the red light chip 22, the green light chip 24, and the blue light chip 26 is small, so that the dot density per unit area of the pixels on the substrate 10 is relatively large, thereby improving the resolution of the LED display screen. The size of the positive electrode pad 122 being large, it is less difficult to bind with each chip, thus making high binding yield rate to improve the yield rate of the display screen.

Figure 3:
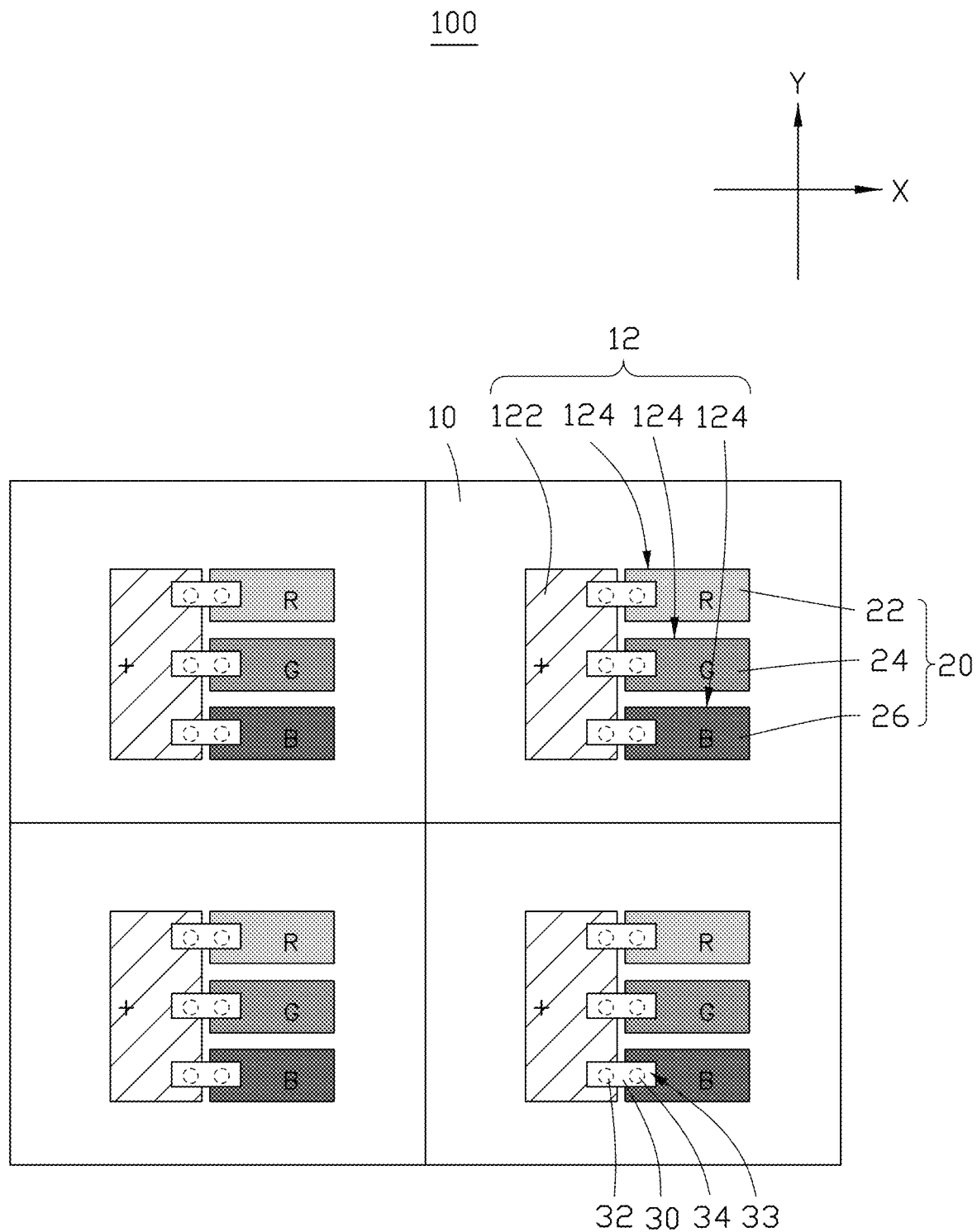
FIG. 3 is a schematic structural diagram of a display screen provided by a third embodiment of the present application.

Referring to FIG. 3, according to a third embodiment of the present disclosure, the structure of the display screen 100 is substantially the same as that of the display screen 100 in the second embodiment. The structure of the display screen 100 in the third embodiment and the display screen 100 in the second embodiment have the following differences.

In the third embodiment, the portion of the first bearing surface 31 with the positive connection terminal 32 is set on the positive pad 122, and the portion of the first bearing surface 31 with the negative connection terminal 34 is set on the red light chip 22, the green light chip 24, or the blue light chip 26.

The above-mentioned display screen 100 in the third embodiment is electrically connected to the red light chip 22, the green light chip 24, and the blue light chip 26 by the positive electrode pad 122. Compared with the overall area of the three positive electrode pads 122 in the prior art, the present disclosure only provides one positive electrode pad 122 which has a smaller area and is less difficult to form, and the overall size of the structure formed by the positive electrode pad 122, the red light chip 22, the green light chip 24, and the blue light chip 26 is small, so that the dot density per unit area of the pixels on the substrate 10 is relatively large, thereby improving the resolution of the LED display screen; and, because the size of the positive electrode pad 122 is large, it is less difficult to bind with each chip, thus making high binding yield rate to improve the yield rate of the display screen.

Figure 4:
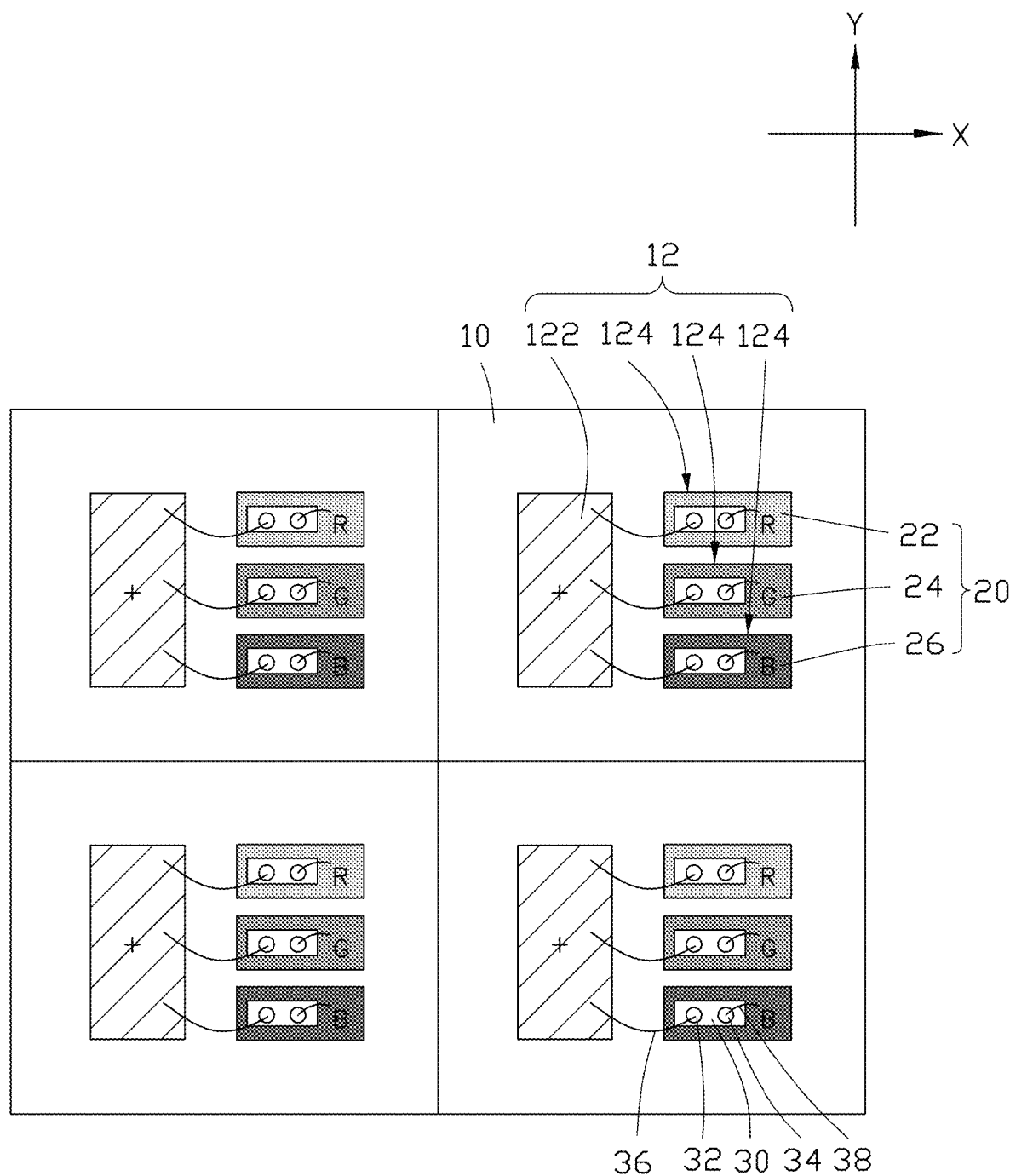
FIG. 4 is a schematic structural diagram of a display screen provided by a fourth embodiment of the present application.

Referring to FIG. 4, according to a fourth embodiment of the present disclosure, the structure of the display screen 100 is substantially the same as that of the display screen 100 in the first embodiment, and the pad structures 12 are also of the first structure in which a plurality of negative electrode pads 124 are arranged in the positive direction of the X-axis of the positive electrode pad 122. The structure of the display screen 100 in the fourth embodiment and the display screen 100 in the first embodiment have the following differences.

In the fourth embodiment, the carrier boards 30 are arranged on the red light chip 22, the green light chip 24, or the blue light chip 26.

The above-mentioned display screen 100 in the fourth embodiment is electrically connected to the red light chip 22, the green light chip 24, and the blue light chip 26 by the positive electrode pad 122. Compared with the overall area of the three positive electrode pads 122 in the prior art, the present disclosure only provides one positive electrode pad 122 which has a smaller area and is less difficult to form, and the overall size of the structure formed by the positive electrode pad 122, the red light chip 22, the green light chip 24, and the blue light chip 26 is small, so that the dot density per unit area of the pixels on the substrate 10 is relatively large, thereby improving the resolution of the LED display screen; and, because the size of the positive electrode pad 122 is large, binding with each chip is less difficult, thus making high binding yield rate to improve the yield rate of the display screen.

Figure 5:
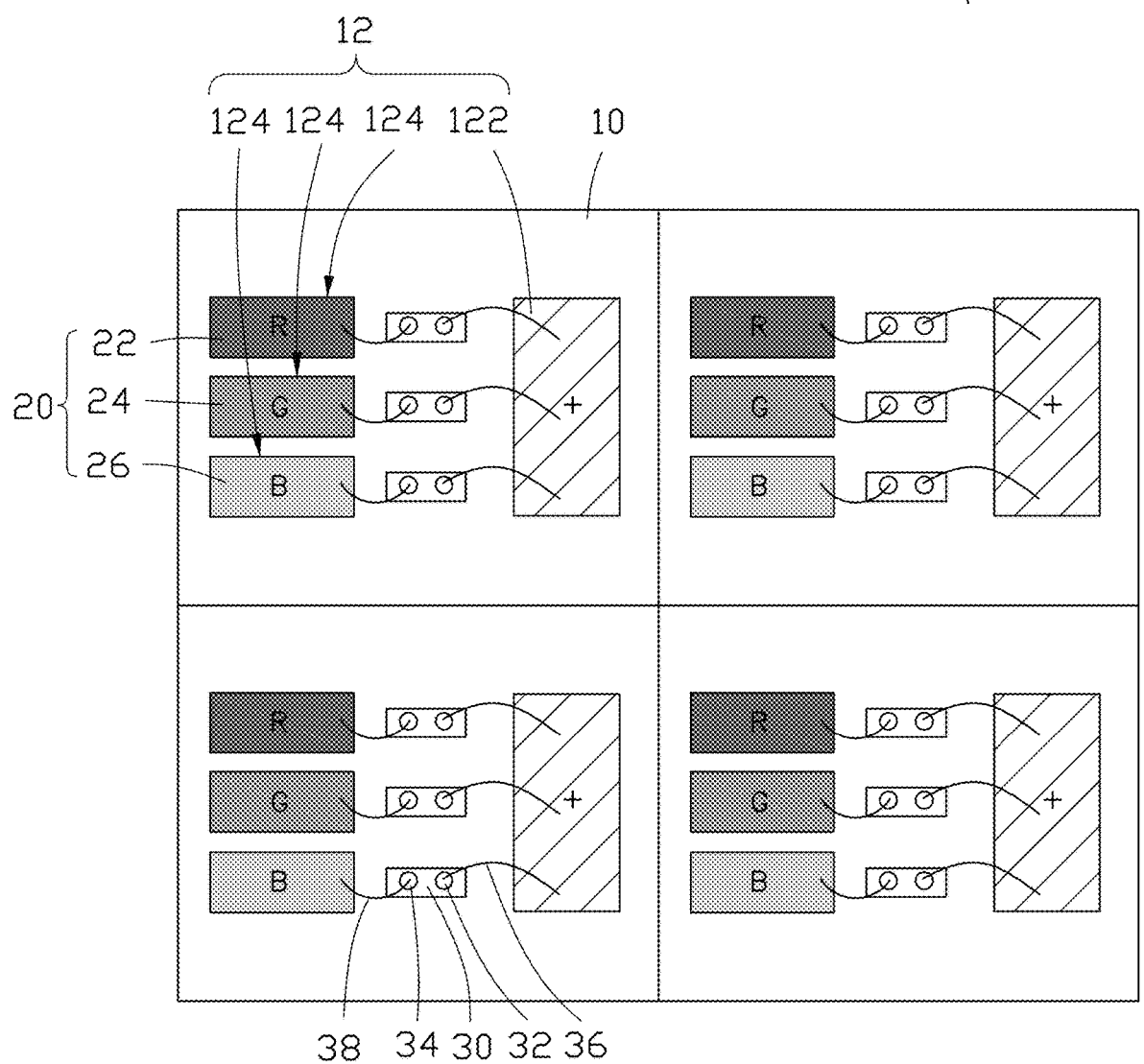
FIG. 5 is a schematic structural diagram of a display screen provided by a fifth embodiment of the present application.

Referring to FIG. 5, according to a fifth embodiment of the present disclosure, the structure of the display screen 100 is substantially the same as that of the display screen 100 in the first embodiment, the carrier board 30 is arranged between the positive electrode pad 122 and the red light chip 22, green light chip 24, or blue light chip 26. The structure of the display screen 100 in the fifth embodiment and the display screen 100 in the first embodiment have the following differences.

In the fifth embodiment, the pad structures 12 are of a second structure. The second structure is a structure in which the negative electrode pads 124 are arranged in the negative direction of the X-axis of the positive electrode pad 122, that is, the negative electrode pad 124 is arranged on the left side of the positive electrode pad 122.

The above-mentioned display screen 100 in the fifth embodiment is electrically connected to the red light chip 22, the green light chip 24, and the blue light chip 26 by the positive electrode pad 122. Compared with the overall area of the three positive electrode pads 122 in the prior art, the present disclosure only provides one positive electrode pad 122 which has a smaller area and is less difficult to form, and the overall size of the structure formed by the positive electrode pad 122, the red light chip 22, the green light chip 24, and the blue light chip 26 is small, so that the dot density per unit area of the pixels on the substrate 10 is relatively large, thereby improving the resolution of the LED display screen; and, because the size of the positive electrode pad 122 is large, it is less difficult to bind with each chip, thus making high binding yield rate to improve the yield rate of the display screen.

Figure 6:
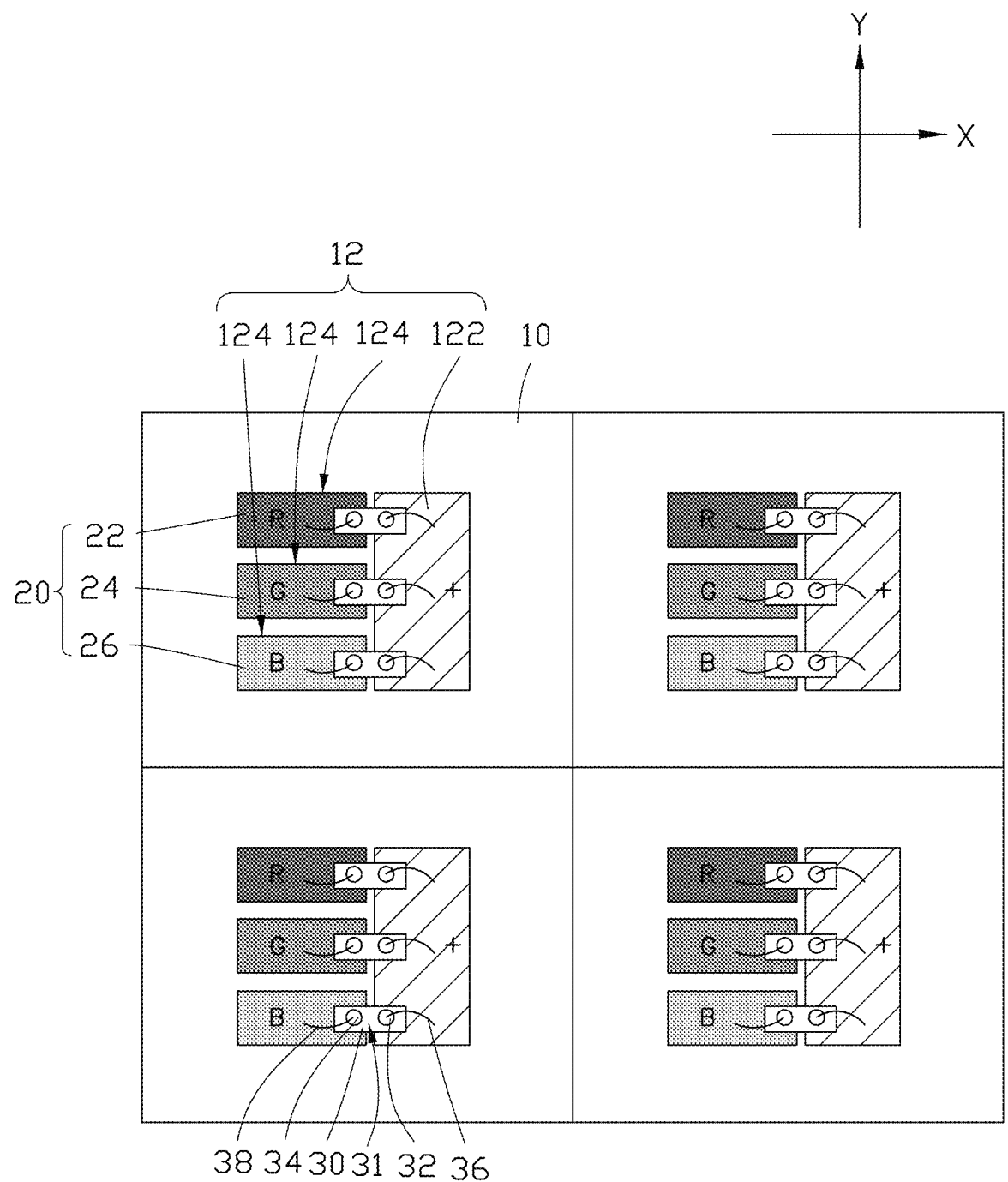
FIG. 6 is a schematic structural diagram of a display screen provided by a sixth embodiment of the present application.

Referring to FIG. 6, according to a sixth embodiment of the present disclosure, the structure of the display screen 100 is substantially the same as that of the display screen 100 in the first embodiment. The structure of the display screen 100 in the sixth embodiment and the display screen 100 in the first embodiment have the following differences.

In the sixth embodiment, the pad structures 12 are of the second structure. The second structure is a structure in which the negative electrode pads 124 are arranged in the negative direction of the X-axis of the positive electrode pad 122.

The carrier board 30 has a first bearing surface 31 and a second bearing surface 33 (shown in FIG. 7) opposite to each other. The positive electrode connection terminal 32 and the negative electrode connection terminal 34 are both provided on the first bearing surface 31, a first part of the second bearing surface 33 is arranged on the positive electrode pad 122, and a second part of the second bearing surface 33 is arranged on the red light chip 22, green light chip 24, or blue light chip 26.

The above-mentioned display screen 100 in the sixth embodiment is electrically connected to the red light chip 22, the green light chip 24, and the blue light chip 26 by the positive electrode pad 122. Compared with the overall area of the three positive electrode pads 122 in the prior art, the present disclosure only provides one positive electrode pad 122 which has a smaller area and is less difficult to form, and the overall size of the structure formed by the positive electrode pad 122, the red light chip 22, the green light chip 24, and the blue light chip 26 is small, so that the dot density per unit area of the pixels on the substrate 10 is relatively large, thereby improving the resolution of the LED display screen; and, because the size of the positive electrode pad 122 is large, it is less difficult to bind with each chip, thus making high binding yield rate to improve the yield rate of the display screen.

Figure 7:
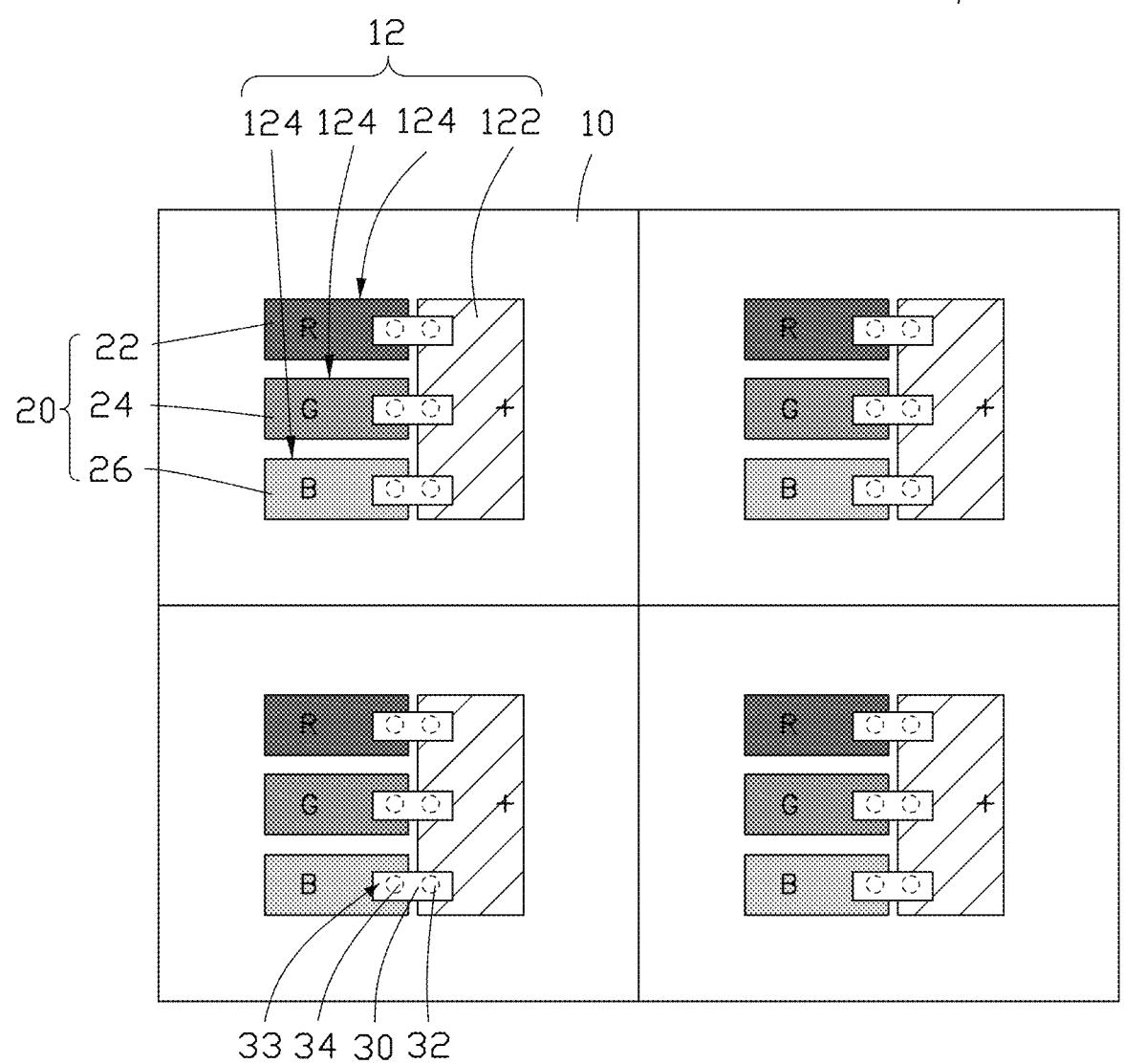
FIG. 7 is a schematic structural diagram of a display screen provided by a seventh embodiment of the present application.

Referring to FIG. 7, according to a seventh embodiment of the present disclosure, the structure of the display screen 100 is substantially the same as that of the display screen 100 in the sixth embodiment. The structure of the display screen 100 in the seventh embodiment and the display screen 100 in the seventh embodiment have the following differences.

In the seventh embodiment, the portion of the first bearing surface 31 with the positive connection terminal 32 is set on the positive pad 122, and the portion of the first bearing surface 31 with the negative connection terminal 34 is set on the red light chip 22, green light chip 24, or blue light chip 26.

The above-mentioned display screen 100 in the seventh embodiment is electrically connected to the red light chip 22, the green light chip 24, and the blue light chip 26 by the positive electrode pad 122. Compared with the overall area of the three positive electrode pads 122 in the prior art, the present disclosure only provides one positive electrode pad 122 which has a smaller area and is less difficult to form, and the overall size of the structure formed by the positive electrode pad 122, the red light chip 22, the green light chip 24, and the blue light chip 26 is small, so that the dot density per unit area of the pixels on the substrate 10 is relatively large, thereby improving the resolution of the LED display screen; and, because the size of the positive electrode pad 122 is large, it is less difficult to bind with each chip, thus making high binding yield rate to improve the yield rate of the display screen.

Figure 8:
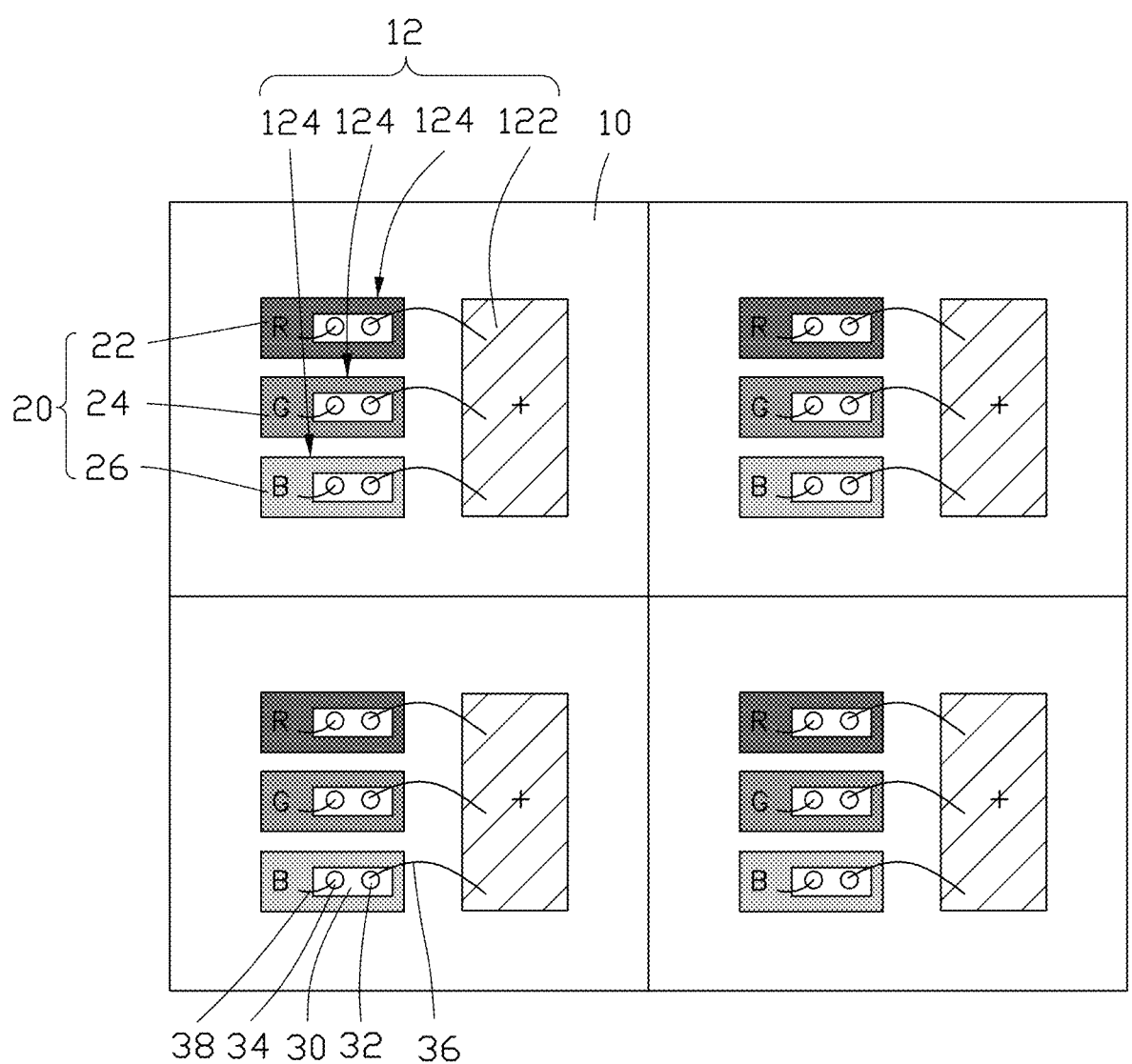
FIG. 8 is a schematic structural diagram of a display screen provided by an eighth embodiment of the present application.

Referring to FIG. 8, according to an eighth embodiment of the present disclosure, the structure of the display screen 100 is substantially the same as that of the display screen 100 in the first embodiment. The structure of the display screen 100 in the eighth embodiment and the display screen 100 in the first embodiment have the following differences.

In the eighth embodiment, each pad structure 12 has a second structure, and the second structure is a structure in which negative electrode pads 124 are positioned in the negative X-axis direction of the positive electrode pad 122.

The carrier board 30 is arranged on the red light chip 22, the green light chip 24, or the blue light chip 26.

The above-mentioned display screen 100 in the eighth embodiment is electrically connected to the red light chip 22, the green light chip 24, and the blue light chip 26 by the positive electrode pad 122. Compared with the overall area of the three positive electrode pads 122 in the prior art, the present disclosure only provides one positive electrode pad 122 which has a smaller area and is less difficult to form, and the overall size of the structure formed by the positive electrode pad 122, the red light chip 22, the green light chip 24, and the blue light chip 26 is small, so that the dot density per unit area of the pixels on the substrate 10 is relatively large, thereby improving the resolution of the LED display screen; and, because the size of the positive electrode pad 122 is large, it is less difficult to bind with each chip, thus making high binding yield rate to improve the yield rate of the display screen.

Figure 9:
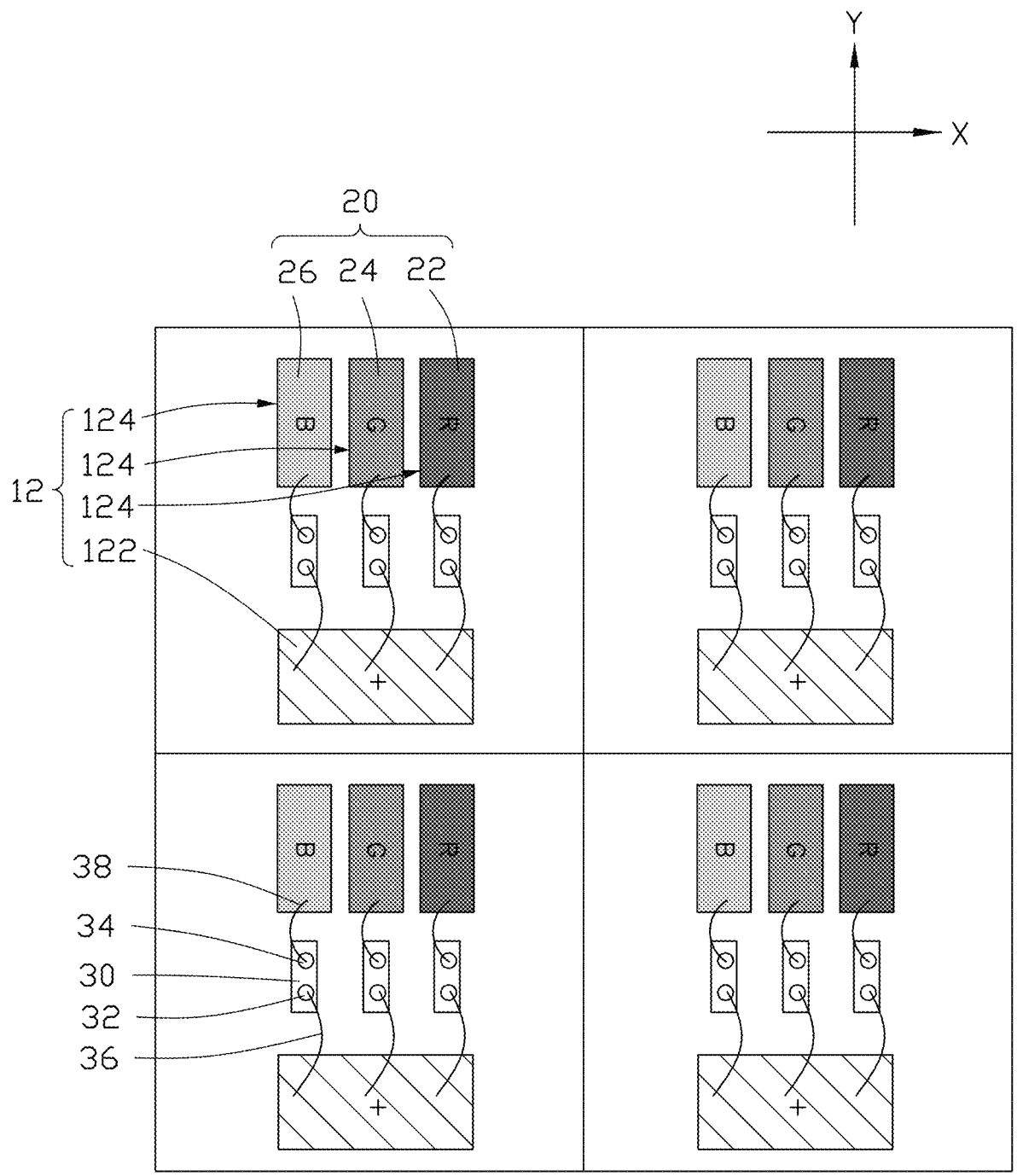
FIG. 9 is a schematic structural diagram of a display screen provided by a ninth embodiment of the present application.

Referring to FIG. 9, according to a ninth embodiment of the present disclosure, the structure of the display screen 100 is substantially the same as that of the display screen 100 in the first embodiment, the carrier board 30 is arranged between the positive electrode pad 122 and the red light chip 22, the green light chip 24, or the blue light chip 26. The structure of the display screen 100 in the ninth embodiment and the display screen 100 in the first embodiment have the following differences.

In the ninth embodiment, each pad structure 12 has a third structure, and the third structure is a structure in which negative electrode pads 124 are arranged in the positive direction of the Y-axis of the positive electrode pad 122, that is, the negative electrode pad 124 is arranged above the positive electrode pad 122.

The above-mentioned display screen 100 in the ninth embodiment is electrically connected to the red light chip 22, the green light chip 24, and the blue light chip 26 by the positive electrode pad 122. Compared with the overall area of the three positive electrode pads 122 in the prior art, the present disclosure only provides one positive electrode pad 122 which has a smaller area and is less difficult to form, and the overall size of the structure formed by the positive electrode pad 122, the red light chip 22, the green light chip 24, and the blue light chip 26 is small, so that the dot density per unit area of the pixels on the substrate 10 is relatively large, thereby improving the resolution of the LED display screen; and, because the size of the positive electrode pad 122 is large, it is less difficult to bind with each chip, thus making high binding yield rate to improve the yield rate of the display screen.

Figure 10:
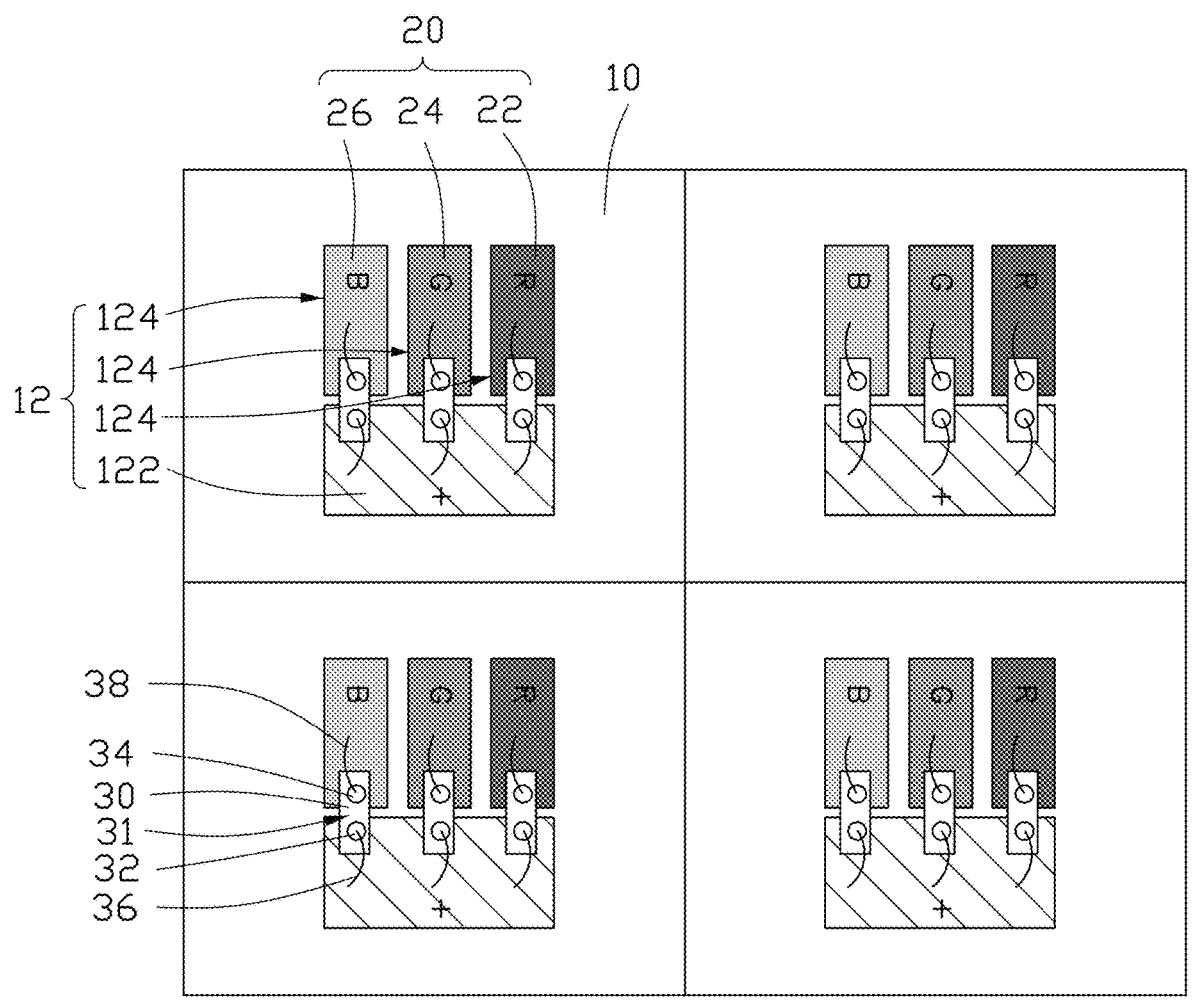
FIG. 10 is a schematic structural diagram of a display screen provided by a tenth embodiment of the present application.

Referring to FIG. 10, according to a tenth embodiment of the present disclosure, the structure of the display screen 100 is substantially the same as that of the display screen 100 in the first embodiment. The structure of the display screen 100 in the tenth embodiment and the display screen 100 in the first embodiment have the following differences.

In the tenth embodiment, each pad structure 12 has the third structure, where negative electrode pads 124 are positioned in the positive direction of the Y axis of the positive electrode pad 122.

The carrier board 30 has a first bearing surface 31 and a second bearing surface 33 (shown in FIG. 11) opposite to each other. The positive electrode connection terminal 32 and the negative electrode connection terminal 34 are both positioned on the first bearing surface 31, and a first part of the second bearing surface 33 is arranged on the positive electrode pad 122, and a second part of the second bearing surface 33 is arranged on the red light chip 22, green light chip 24, or blue light chip 26.

The above-mentioned display screen 100 in the tenth embodiment is electrically connected to the red light chip 22, the green light chip 24, and the blue light chip 26 by the positive electrode pad 122. Compared with the overall area of the three positive electrode pads 122 in the prior art, the present disclosure only provides one positive electrode pad 122 which has a smaller area and is less difficult to form, and the overall size of the structure formed by the positive electrode pad 122, the red light chip 22, the green light chip 24, and the blue light chip 26 is small, so that the dot density per unit area of the pixels on the substrate 10 is relatively large, thereby improving the resolution of the LED display screen; and, because the size of the positive electrode pad 122 is large, it is less difficult to bind with each chip, thus making high binding yield rate to improve the yield rate of the display screen.

Figure 11:
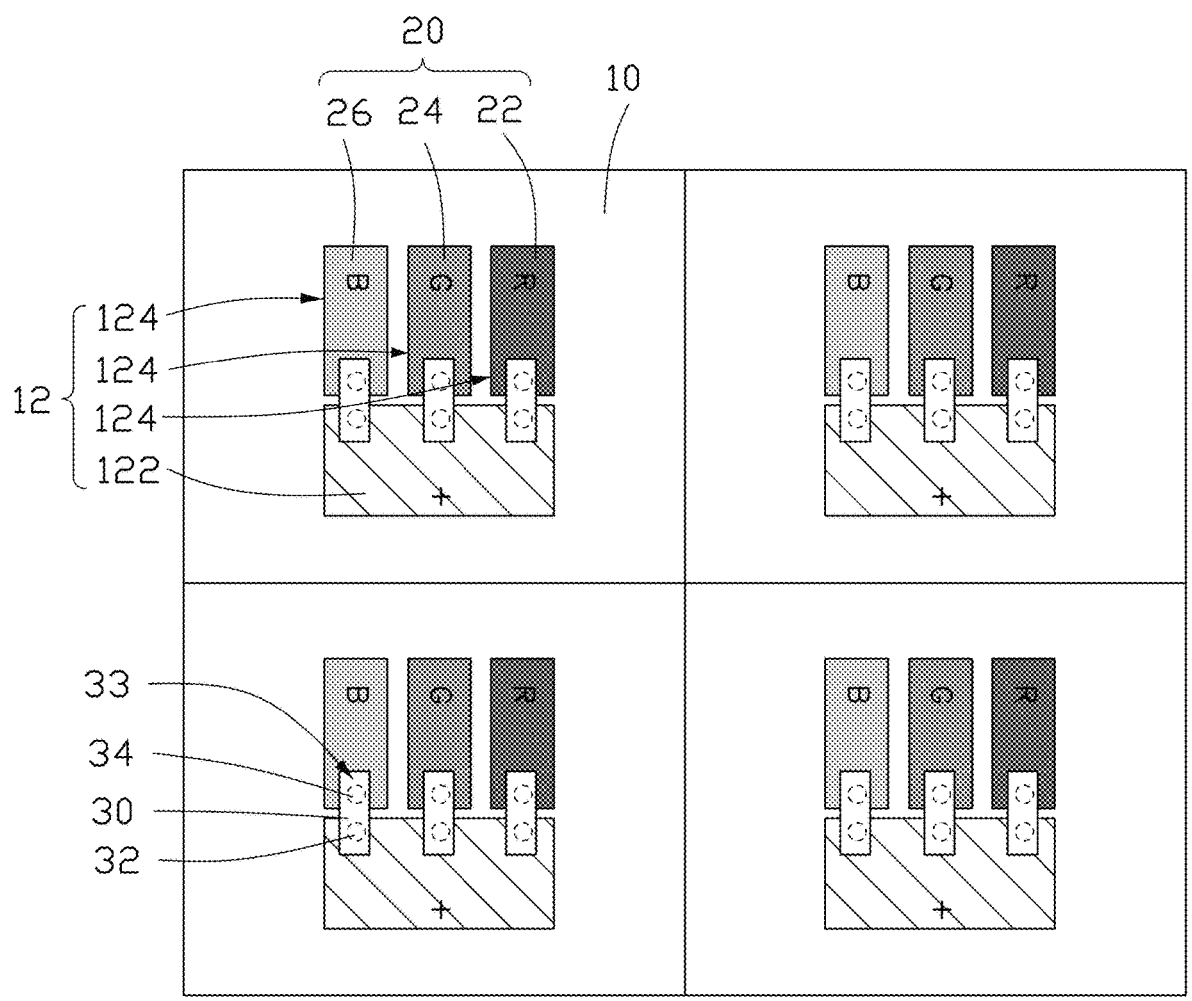
FIG. 11 is a schematic structural diagram of a display screen provided by an eleventh embodiment of the present application.

Referring to FIG. 11, according to an eleventh embodiment of the present disclosure, the structure of the display screen 100 is substantially the same as that of the display screen 100 in the tenth embodiment. The structure of the display screen 100 in the eleventh embodiment and the display screen 100 in the tenth embodiment have the following differences.

In the eleven embodiment, the portion of the first bearing surface 31 with the positive connection terminal 32 is set on the positive pad 122, and the portion of the first bearing surface 31 with the negative connection terminal 34 is set on the red light chip 22, the green light chip 24, or the blue light chip 26.

The above-mentioned display screen 100 in the eleventh embodiment is electrically connected to the red light chip 22, the green light chip 24, and the blue light chip 26 by the positive electrode pad 122. Compared with the overall area of the three positive electrode pads 122 in the prior art, the present disclosure only provides one positive electrode pad 122 which has a smaller area and is less difficult to form, and the overall size of the structure formed by the positive electrode pad 122, the red light chip 22, the green light chip 24, and the blue light chip 26 is small, so that the dot density per unit area of the pixels on the substrate 10 is relatively large, thereby improving the resolution of the LED display screen; and, because the size of the positive electrode pad 122 is large, it is less difficult to bind with each chip, thus making high binding yield rate to improve the yield rate of the display screen.

Figure 12:
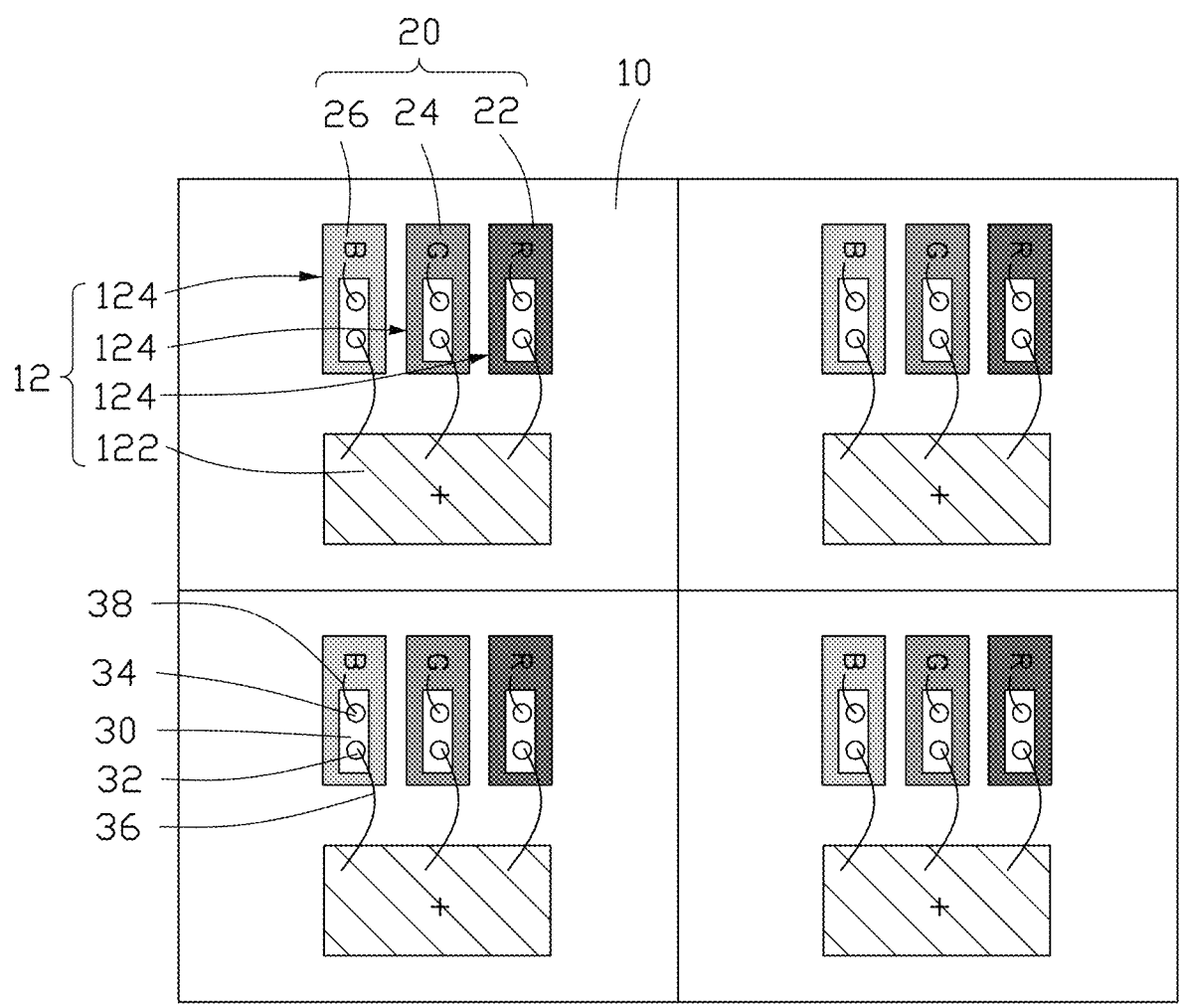
FIG. 12 is a schematic structural diagram of a display screen provided by a twelfth embodiment of the present application.

Referring to FIG. 12, according to a twelfth embodiment of the present disclosure, the structure of the display screen 100 is substantially the same as that of the display screen 100 in the first embodiment. The structure of the display screen 100 in the twelfth embodiment and the display screen 100 in the first embodiment have the following differences.

In the twelfth embodiment, each pad structure 12 has the third structure.

The carrier board 30 is arranged on the red light chip 22, green light chip 24, or blue light chip 26.

The above-mentioned display screen 100 in the twelfth embodiment is electrically connected to the red light chip 22, the green light chip 24, and the blue light chip 26 by the positive electrode pad 122. Compared with the overall area of the three positive electrode pads 122 in the prior art, the present disclosure only provides one positive electrode pad 122 which has a smaller area and is less difficult to form, and the overall size of the structure formed by the positive electrode pad 122, the red light chip 22, the green light chip 24, and the blue light chip 26 is small, so that the dot density per unit area of the pixels on the substrate 10 is relatively large, thereby improving the resolution of the LED display screen; and, because the size of the positive electrode pad 122 is large, it is less difficult to bind with each chip, thus making high binding yield rate to improve the yield rate of the display screen.

Figure 13:
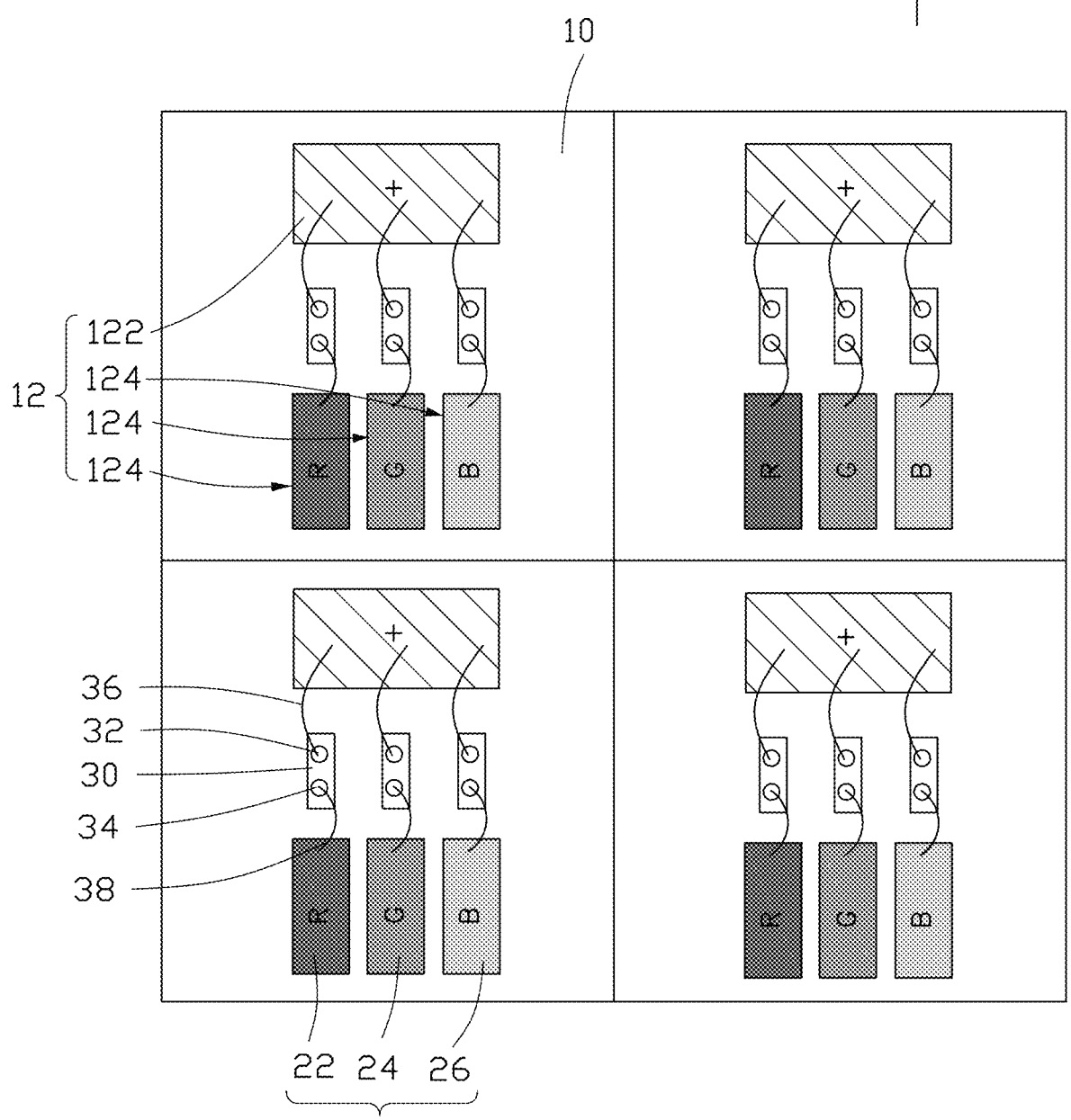
FIG. 13 is a schematic structural diagram of a display screen provided by a thirteenth embodiment of the present application.

Referring to FIG. 13, according to a thirteenth embodiment of the present disclosure, the structure of the display screen 100 is substantially the same as that of the display screen 100 in the first embodiment, the carrier board 30 is arranged between the positive electrode pad 122 and the corresponding red light chip 22, green light chip 24, or blue light chip 26. The structure of the display screen 100 in the thirteenth embodiment and the display screen 100 in the first embodiment have the following differences.

In the thirteenth embodiment, each pad structures 12 has a fourth structure, and the fourth structure is a structure in which negative electrode pads 124 are arranged in the negative direction of the Y axis of the positive electrode pad 122, that is, the negative electrode pad 124 is arranged below the positive electrode pad 122.

The above-mentioned display screen 100 in the thirteenth embodiment is electrically connected to the red light chip 22, the green light chip 24, and the blue light chip 26 by the positive electrode pad 122. Compared with the overall area of the three positive electrode pads 122 in the prior art, the present disclosure only provides one positive electrode pad 122 which has a smaller area and is less difficult to form, and the overall size of the structure formed by the positive electrode pad 122, the red light chip 22, the green light chip 24, and the blue light chip 26 is small, so that the dot density per unit area of the pixels on the substrate 10 is relatively large, thereby improving the resolution of the LED display screen; and, because the size of the positive electrode pad 122 is large, it is less difficult to bind with each chip, thus making high binding yield rate to improve the yield rate of the display screen.

Figure 14:
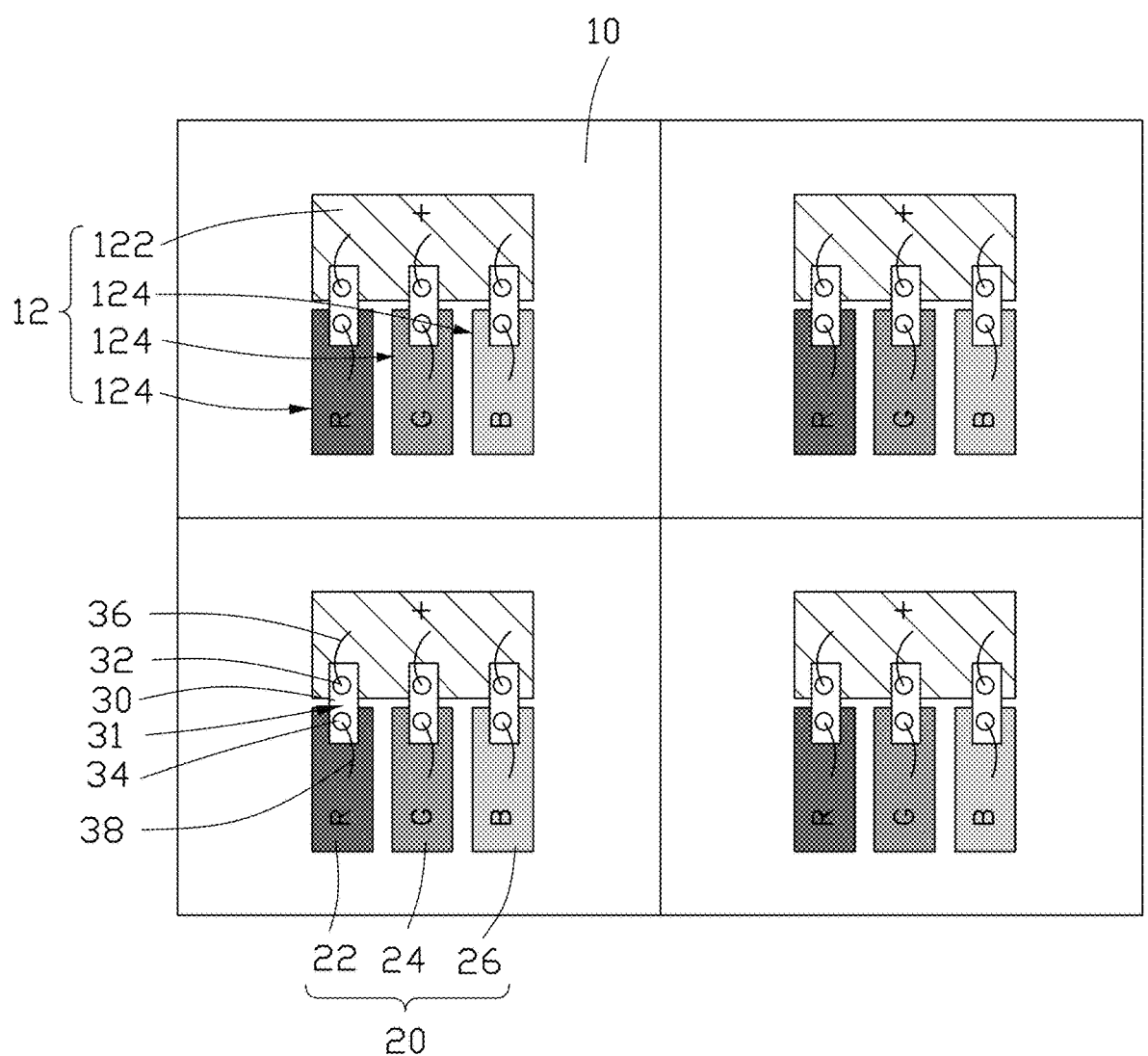
FIG. 14 is a schematic structural diagram of a display screen provided by a fourteenth embodiment of the present application.

Referring to FIG. 14, according to a fourteenth embodiment of the present disclosure, the structure of the display screen 100 is substantially the same as that of the display screen 100 in the first embodiment. The structure of the display screen 100 in the fourteenth embodiment and the display screen 100 in the first embodiment have the following differences.

In the fourteenth embodiment, each pad structures 12 has the fourth structure.

The carrier board 30 has a first bearing surface 31 and a second bearing surface 33 (shown in FIG. 15) opposite to each other. The positive electrode connecting end 32 and the negative electrode connecting end 34 are both positioned on the first bearing surface 31, a first part of the second bearing surface 33 is arranged on the positive electrode pad 122, and a second part of the second bearing surface 33 is arranged on the red light chip 22, green light chip 24, or blue light chip 26.

The above-mentioned display screen 100 in the fourteenth embodiment is electrically connected to the red light chip 22, the green light chip 24, and the blue light chip 26 by the positive electrode pad 122. Compared with the overall area of the three positive electrode pads 122 in the prior art, the present disclosure only provides one positive electrode pad 122 which has a smaller area and is less difficult to form, and the overall size of the structure formed by the positive electrode pad 122, the red light chip 22, the green light chip 24, and the blue light chip 26 is small, so that the dot density per unit area of the pixels on the substrate 10 is relatively large, thereby improving the resolution of the LED display screen; and, because the size of the positive electrode pad 122 is large, it is less difficult to bind with each chip, thus making high binding yield rate to improve the yield rate of the display screen.

Figure 15:
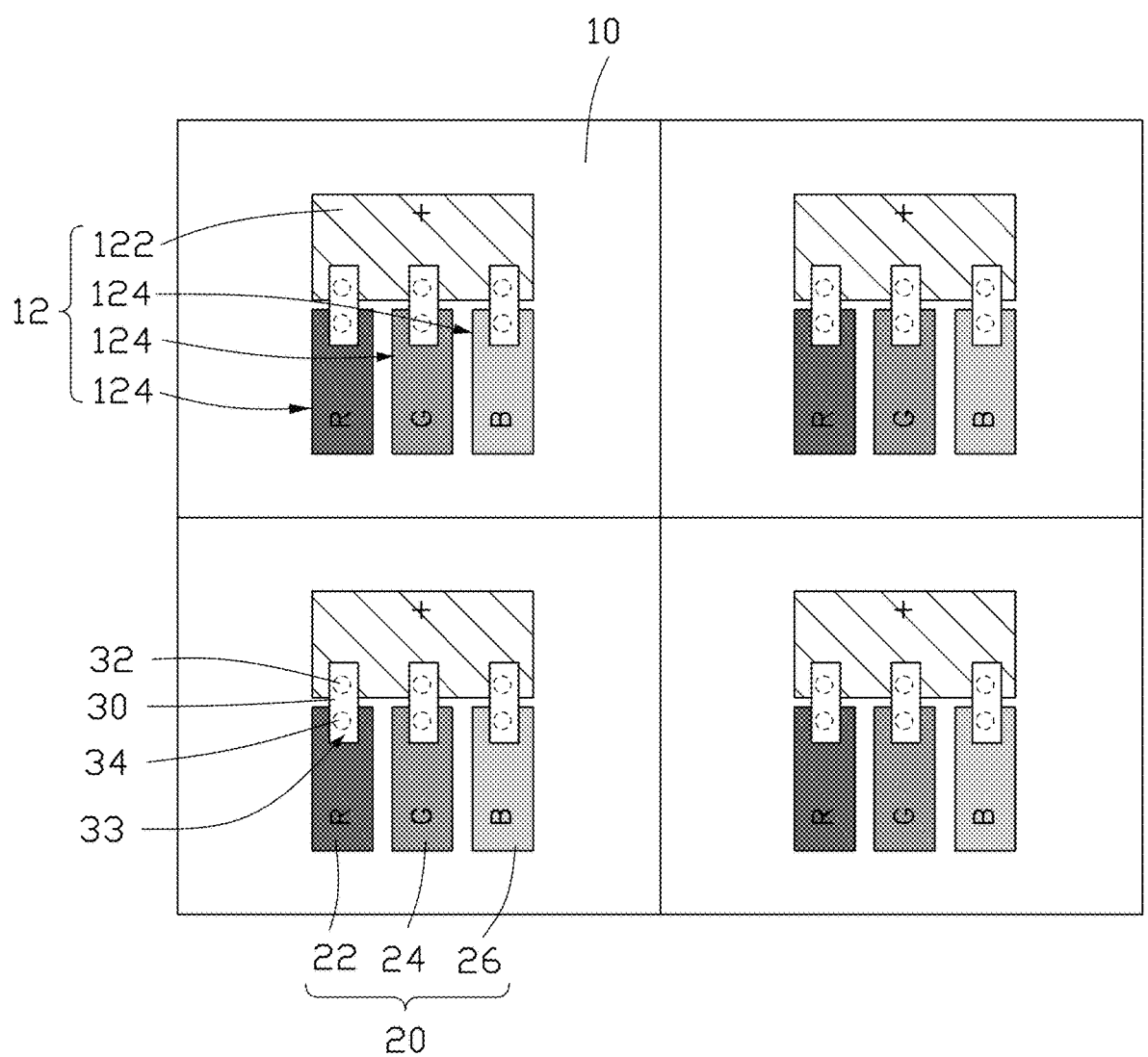
FIG. 15 is a schematic structural diagram of a display screen provided by a fifteenth embodiment of the present application.

Referring to FIG. 15, according to a fifteenth embodiment of the present disclosure, the structure of the display screen 100 is substantially the same as that of the display screen 100 in the fourteenth embodiment. The structure of the display screen 100 in the fifteenth embodiment and the display screen 100 in the fourteenth embodiment have the following differences.

In the fifteenth embodiment, the portion of the first bearing surface 31 with the positive connection terminal 32 is set on the positive pad 122, and the portion of the first bearing surface 31 with the negative connection terminal 34 is set on the red light chip 22, green light chip 24, or blue light chip 26.

The above-mentioned display screen 100 in the fifteenth embodiment is electrically connected to the red light chip 22, the green light chip 24, and the blue light chip 26 by the positive electrode pad 122. Compared with the overall area of the three positive electrode pads 122 in the prior art, the present disclosure only provides one positive electrode pad 122 which has a smaller area and is less difficult to form, and the overall size of the structure formed by the positive electrode pad 122, the red light chip 22, the green light chip 24, and the blue light chip 26 is small, so that the dot density per unit area of the pixels on the substrate 10 is relatively large, thereby improving the resolution of the LED display screen; and, because the size of the positive electrode pad 122 is large, it is less difficult to bind with each chip, thus making high binding yield rate to improve the yield rate of the display screen.

Figure 16:
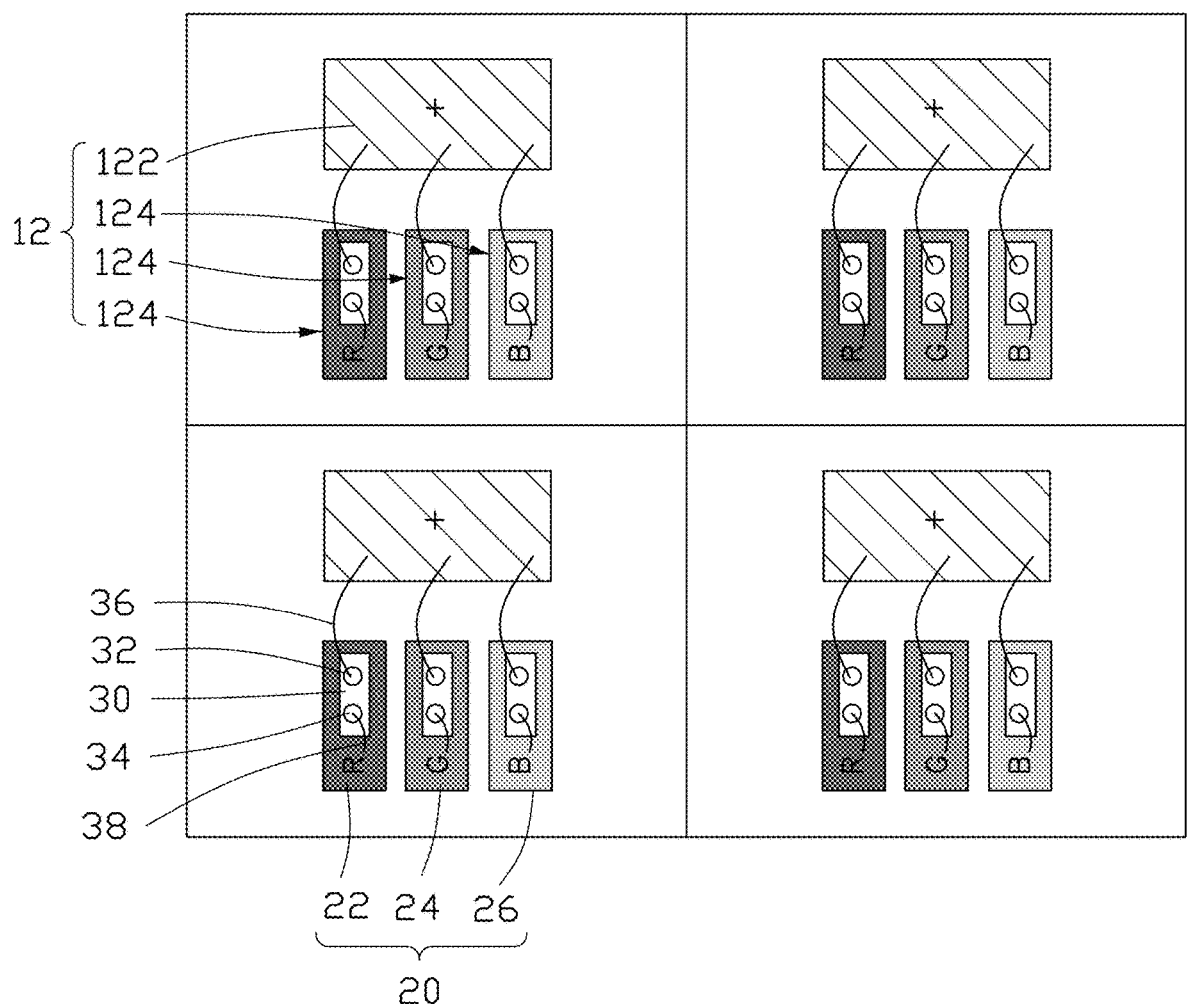
FIG. 16 is a schematic structural diagram of a display screen provided by a sixteenth embodiment of the present application.

Referring to FIG. 16, according to a sixteenth embodiment of the present disclosure, the structure of the display screen 100 is substantially the same as that of the display screen 100 in the first embodiment. The structure of the display screen 100 in the sixteenth embodiment and the display screen 100 in the first embodiment have the following differences.

In the sixteenth embodiment, each pad structure 12 has the fourth structure.

The carrier board 30 is arranged on the red light chip 22, green light chip 24, or blue light chip 26.

The above-mentioned display screen 100 in the sixteenth embodiment is electrically connected to the red light chip 22, the green light chip 24, and the blue light chip 26 by the positive electrode pad 122. Compared with the overall area of the three positive electrode pads 122 in the prior art, the present disclosure only provides one positive electrode pad 122 which has a smaller area and is less difficult to form, and the overall size of the structure formed by the positive electrode pad 122, the red light chip 22, the green light chip 24, and the blue light chip 26 is small, so that the dot density per unit area of the pixels on the substrate 10 is relatively large, thereby improving the resolution of the LED display screen; and, because the size of the positive electrode pad 122 is large, it is less difficult to bind with each chip, thus making high binding yield rate to improve the yield rate of the display screen.

Figure 17:
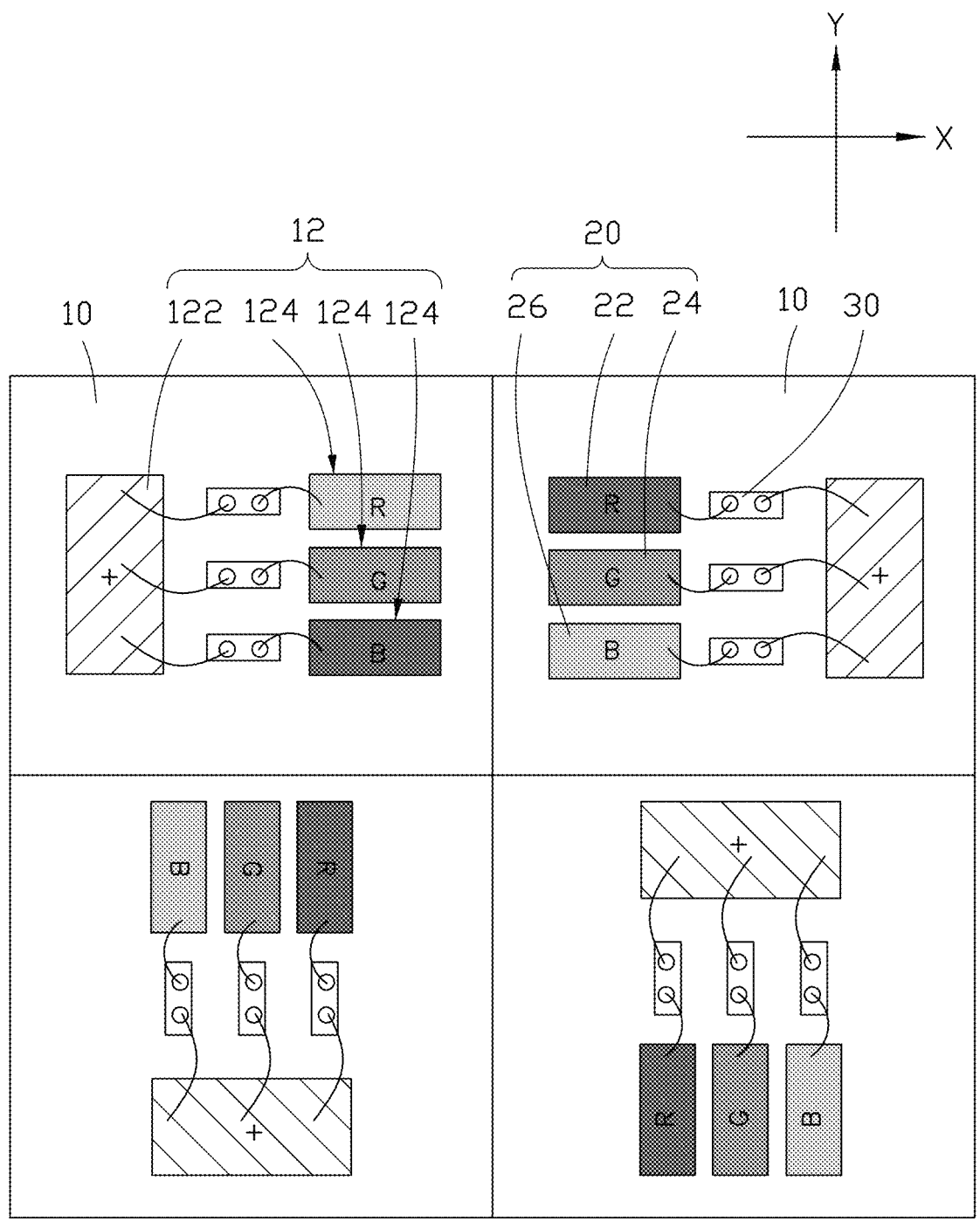
FIG. 17 is a schematic structural diagram of a display screen provided by a seventeenth embodiment of the present application.

Referring to FIG. 17, according to a seventeenth embodiment of the present disclosure, the structure of the display screen 100 is substantially the same as that of the display screen 100 in the first embodiment, the carrier board 30 is arranged between the positive electrode pad 122 and the red light chip 22, green light chip 24, or blue light chip 26. The structure of the display screen 100 in the seventeenth embodiment and the display screen 100 in the first embodiment have the following differences.

In the seventeenth embodiment, the pad structures 12 include two of (at least) the first structure, the second structure, the third structure, and the fourth structure. For example, in this embodiment, the pad structures 12 includes the first structure, the second structure, the third structure, and the fourth structure. In other embodiments, the pad structures 12 includes any two of the first structure, the second structure, the third structure, and the fourth structure; or the pad structure 12 can include any three of the first structure, the second structure, the third structure, and the fourth structure.

The above-mentioned display screen 100 in the seventeenth embodiment is electrically connected to the red light chip 22, the green light chip 24, and the blue light chip 26 by the positive electrode pad 122. Compared with the overall area of the three positive electrode pads 122 in the prior art, the present disclosure only provides one positive electrode pad 122 which has a smaller area and is less difficult to form, and the overall size of the structure formed by the positive electrode pad 122, the red light chip 22, the green light chip 24, and the blue light chip 26 is small, so that the dot density per unit area of the pixels on the substrate 10 is relatively large, thereby improving the resolution of the LED display screen; and, because the size of the positive electrode pad 122 is large, it is less difficult to bind with each chip, thus making high binding yield rate to improve the yield rate of the display screen.

Figure 18:
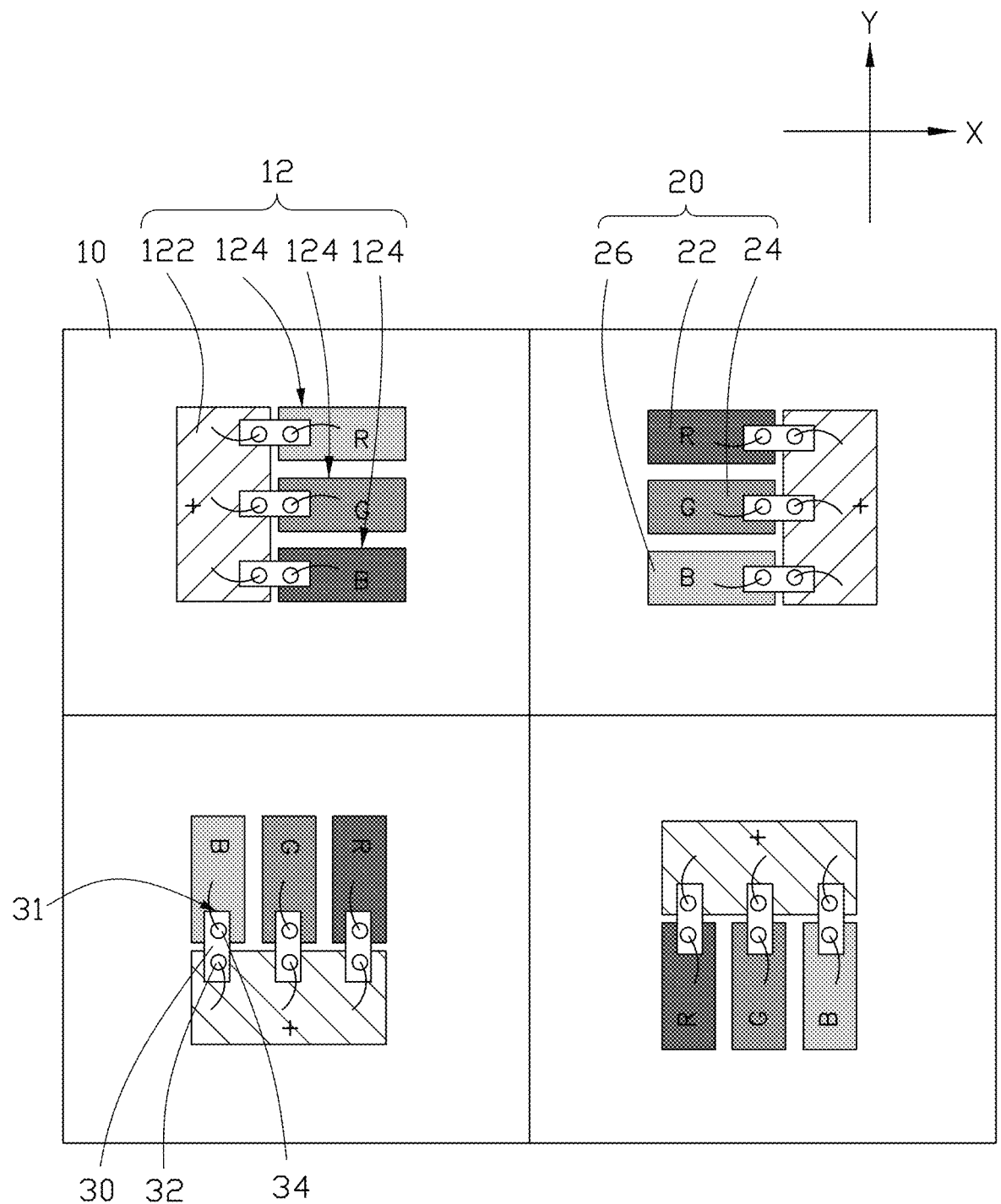
FIG. 18 is a schematic structural diagram of a display screen provided by an eighteenth embodiment of the present application.

Referring to FIG. 18, according to an eighteenth embodiment of the present disclosure, the structure of the display screen 100 is substantially the same as that of the display screen 100 in the first embodiment. The structure of the display screen 100 in the eighteenth embodiment and the display screen 100 in the first embodiment have the following differences.

In the eighteenth embodiment, the pad structures 12 include at least two of the first structure, the second structure, the third structure, and the fourth structure. For example, in this embodiment, the pad structures 12 includes the first structure, the second structure, the third structure, and the fourth structure.

Figure 19:
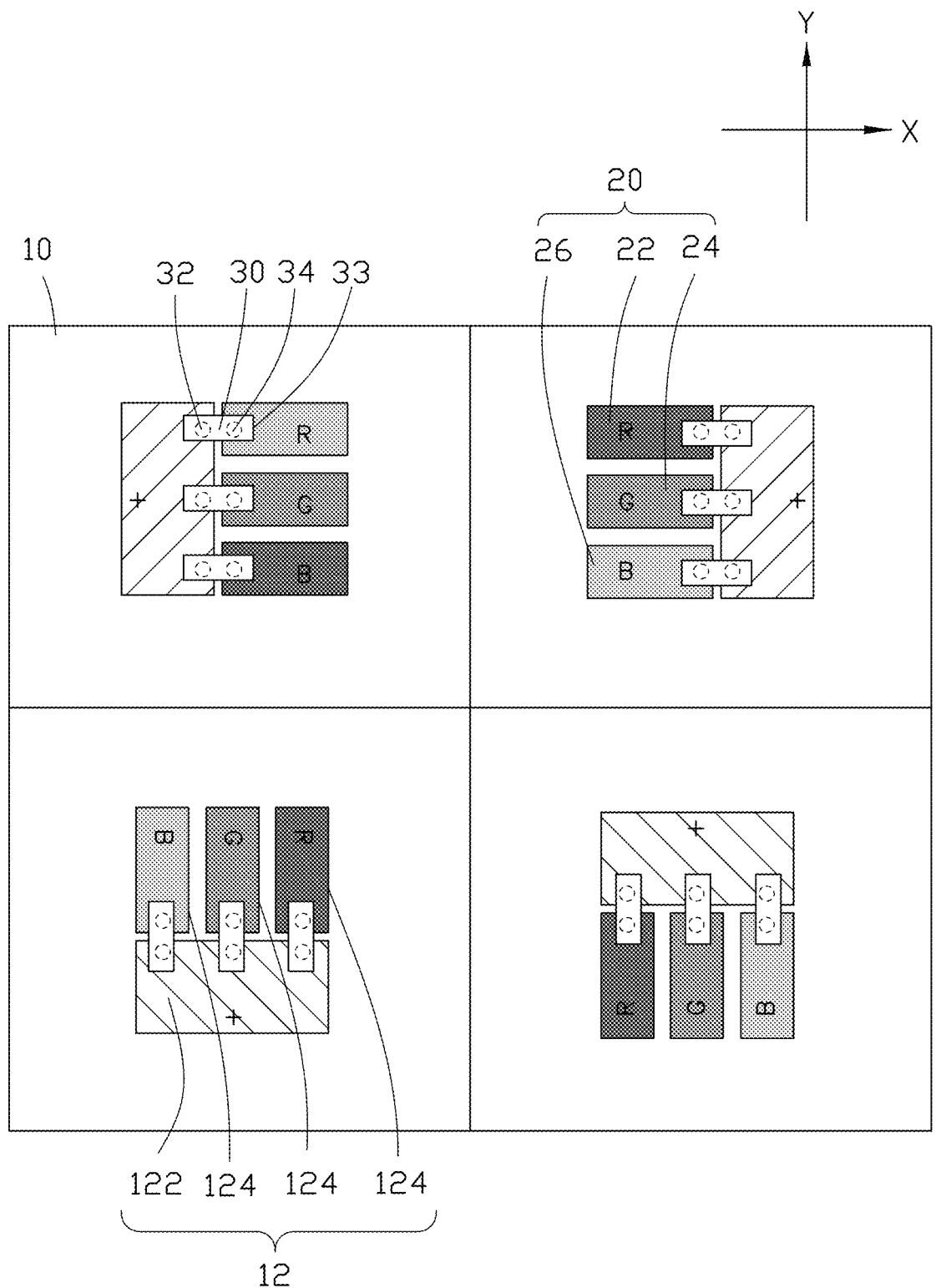
FIG. 19 is a schematic structural diagram of a display screen provided by a nineteenth embodiment of the present application.

The carrier board 30 has a first bearing surface 31 and a second bearing surface 33 (shown in FIG. 19). The positive connecting end 32 and the negative connecting end 34 are both positioned on the first carrying surface 31, a first part of the second carrying surface 33 is arranged on the positive electrode pad 122, and a second part of the second bearing surface 33 is arranged on the red light chip 22, green light chip 24, or blue light chip 26.

The above-mentioned display screen 100 in the eighteenth embodiment is electrically connected to the red light chip 22, the green light chip 24, and the blue light chip 26 by the positive electrode pad 122. Compared with the overall area of the three positive electrode pads 122 in the prior art, the present disclosure only provides one positive electrode pad 122 which has a smaller area and is less difficult to form, and the overall size of the structure formed by the positive electrode pad 122, the red light chip 22, the green light chip 24, and the blue light chip 26 is small, so that the dot density per unit area of the pixels on the substrate 10 is relatively large, thereby improving the resolution of the LED display screen; and, because the size of the positive electrode pad 122 is large, it is less difficult to bind with each chip, thus making high binding yield rate to improve the yield rate of the display screen.

Referring to FIG. 19, according to a nineteenth embodiment of the present disclosure, the structure of the display screen 100 is substantially the same as that of the display screen 100 in the first embodiment. The structure of the display screen 100 in the nineteenth embodiment and the display screen 100 in the first embodiment have the following differences.

In the nineteenth embodiment, the portion of the first bearing surface 31 with the positive connection terminal 32 is set on the positive pad 122, and the portion of the first bearing surface 31 with the negative connection terminal 34 is set on the red light chip 22, green light chip 24, or blue light chip 26.

The above-mentioned display screen 100 in the nineteenth embodiment is electrically connected to the red light chip 22, the green light chip 24, and the blue light chip 26 by the positive electrode pad 122. Compared with the overall area of the three positive electrode pads 122 in the prior art, the present disclosure only provides one positive electrode pad 122 which has a smaller area and is less difficult to form, and the overall size of the structure formed by the positive electrode pad 122, the red light chip 22, the green light chip 24, and the blue light chip 26 is small, so that the dot density per unit area of the pixels on the substrate 10 is relatively large, thereby improving the resolution of the LED display screen; and, because the size of the positive electrode pad 122 is large, it is less difficult to bind with each chip, thus making high binding yield rate to improve the yield rate of the display screen.

Figure 20:
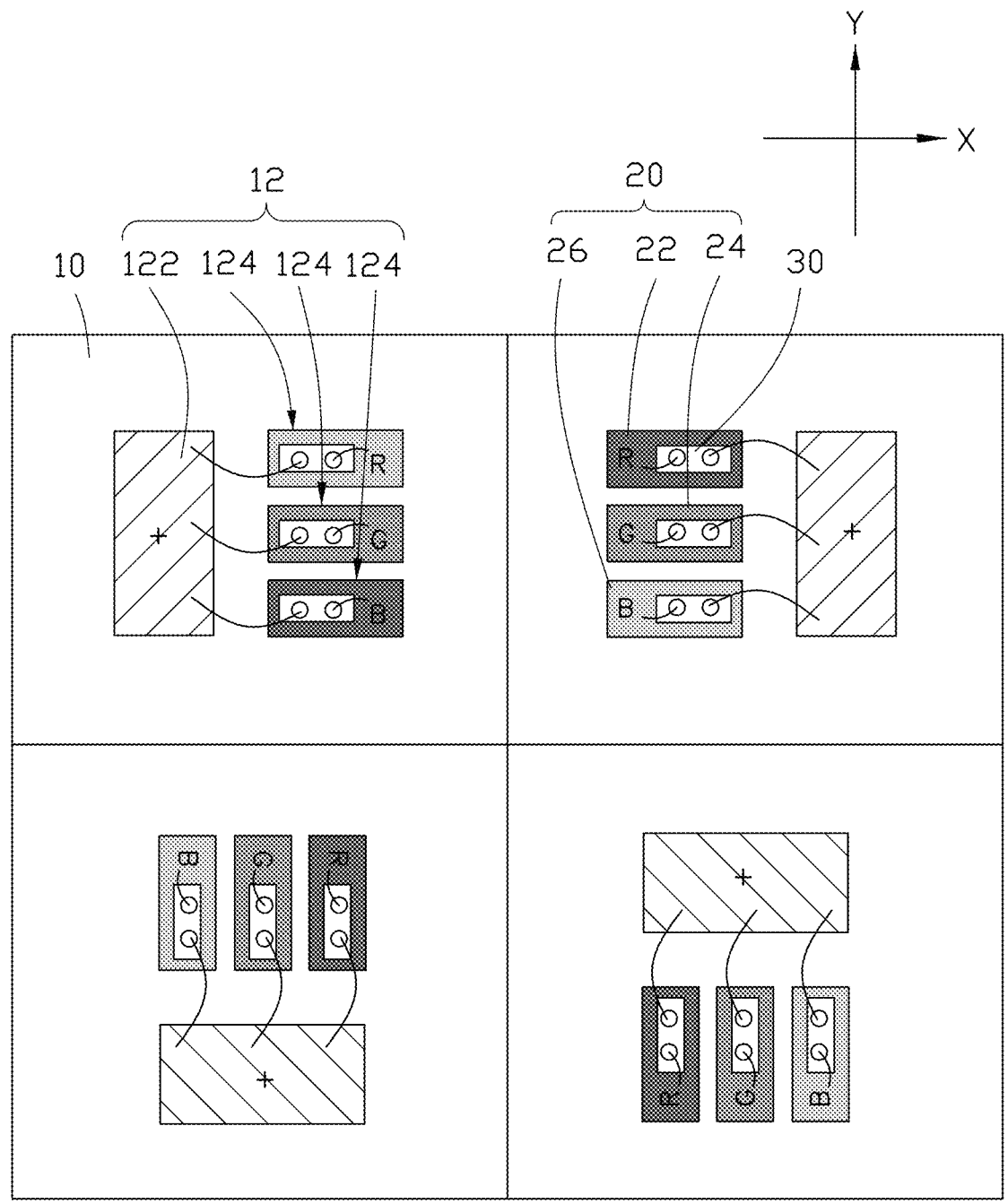
FIG. 20 is a schematic structural diagram of a display screen provided by a twentieth embodiment of the present application.

Referring to FIG. 20, according to a twentieth embodiment of the present disclosure, the structure of the display screen 100 is substantially the same as that of the display screen 100 in the first embodiment. The structure of the display screen 100 in the twentieth embodiment and the display screen 100 in the first embodiment have the following differences.

In the twentieth embodiment, the pad structures 12 include at least two of the first structure, the second structure, the third structure, and the fourth structure. For example, in this embodiment, the pad structures 12 includes the first structure, the second structure, the third structure, and the fourth structure.

The carrier board 30 is arranged on the red light chip 22, green light chip 24, or blue light chip 26.

The above-mentioned display screen 100 in the twentieth embodiment is electrically connected to the red light chip 22, the green light chip 24, and the blue light chip 26 by the positive electrode pad 122. Compared with the overall area of the three positive electrode pads 122 in the prior art, the present disclosure only provides one positive electrode pad 122 which has a smaller area and is less difficult to form, and the overall size of the structure formed by the positive electrode pad 122, the red light chip 22, the green light chip 24, and the blue light chip 26 is small, so that the dot density per unit area of the pixels on the substrate 10 is relatively large, thereby improving the resolution of the LED display screen; and, because the size of the positive electrode pad 122 is large, it is less difficult to bind with each chip, thus making high binding yield rate to improve the yield rate of the display screen.

Figure 21:
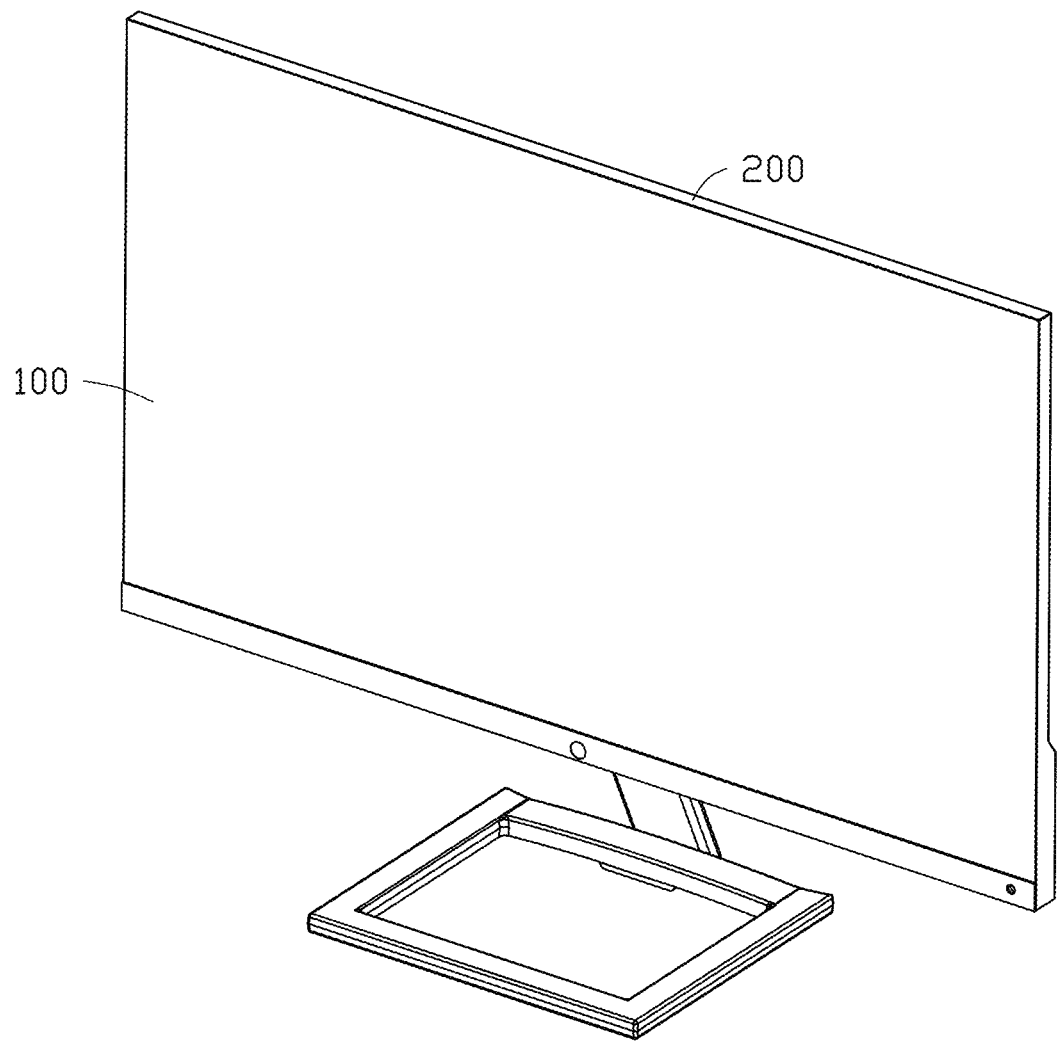
FIG. 21 is a schematic structural diagram of a displaying device in one embodiment of the present application.

Referring to FIG. 21, a displaying device 300 includes a main body 200 and the above-mentioned display screen 100, and the display screen 100 is connected to the main body 200.

The positive electrode pads 122 of above-mentioned displaying device 300 are electrically connected to the red light chip 22, the green light chip 24, and the blue light chip 26. Compared with three positive electrode pads 122 in the prior art, the present disclosure only provides one positive electrode pad 122 which has a smaller area and is less difficult to form, and the overall size of the structure formed by the positive electrode pad 122, the red light chip 22, the green light chip 24, and the blue light chip 26 is small, so that the dot density per unit area of the pixels on the substrate 10 is relatively large, thereby improving the resolution of the LED display screen; and, because the size of the positive electrode pad 122 is large, it is less difficult to bind with each chip, thus making high binding yield rate to improve the yield rate of the display screen.

The embodiments shown and described above are only examples. Therefore, many commonly-known features and details are neither shown nor described. Even though numerous characteristics and advantages of the present technology have been set forth in the foregoing description, together with details of the structure and function of the present disclosure, the disclosure is illustrative only, and changes may be made in the detail, including in matters of shape, size, and arrangement of the parts within the principles of the present disclosure, up to and including the full extent established by the broad general meaning of the terms used in the claims. It will, therefore, be appreciated that the embodiments described above may be modified within the scope of the claims.

What is claimed is:

1. A display screen, comprising:
   a substrate, comprising a plurality of pad structures, the plurality of pad structures being arranged on a surface of the substrate in an array, each of the pad structures comprising a positive electrode pad and three negative electrode pads, wherein the three negative electrode pads are positioned on a side of the positive electrode pad and arranged side by side;
   a plurality of LED chips, respectively arranged in a one-to-one correspondence with the pad structures, and each of the LED chips comprising a red light chip, a green light chip and a blue light chip, wherein positive electrodes of the red light chip, the green light chip, and the blue light chip correspond to the positive electrode pad, and negative electrodes of the red light chip, the green light chip, and the blue light chip correspond to the three negative electrode pads; and
   a plurality of carrier boards, respectively arranged corresponding to the red light chip, the green light chip and the blue light chip, each of the carrier boards comprising a positive electrode connection terminal and a negative electrode connection terminal, wherein the positive electrode connection terminal is electrically connected to the positive electrode pad, the negative electrode connection terminal is electrically connected to corresponding red light chip, the green light chip or the blue light chip.

2. The display screen of claim 1, wherein spaces between each of the negative electrode pads and each of the positive electrode pads are same.

3. The display screen of claim 1, wherein the pad structures have at least one of a first structure, a second structure, a third structure, and a fourth structure, and a plurality of the negative electrode pads are respectively arranged on the first structure in a positive direction of X-axis of the positive electrode pad, a plurality of the negative electrode pads are respectively arranged on the second structure in a negative direction of the X-axis of the positive electrode pad, a plurality of the negative electrode pads are respectively arranged on the third structure in a positive direction of the Y-axis of the positive electrode pad, a plurality of the negative electrode pads are respectively arranged on the fourth structure in a negative direction of the Y axis of the positive electrode pad.

4. The display screen of claim 3, wherein the carrier boards are arranged on corresponding red light chip, the green light chip or the blue light chip.

5. The display screen of claim 3, wherein one of the plurality of carrier boards is arranged between the positive electrode pad and the corresponding red light chip, the green light chip or the blue light chip.

6. The display screen of claim 3, wherein the carrier board comprises a first bearing surface and a second bearing surface opposite to each other, the positive electrode connection terminal and the negative electrode connection terminal are both positioned on the first bearing surface, and a first part of the second bearing surface is positioned on the positive electrode pad, a second part of the second bearing surface is positioned on the corresponding red light chip, the green light chip or the blue light chip.

7. The display screen of claim 3, wherein the carrier board comprises a first bearing surface and a second bearing surface opposite to each other, the positive electrode connection terminal and the negative electrode connection terminal are both positioned on the first bearing surface, a part of the first bearing surface with the positive electrode connection terminal is positioned on the positive electrode pad, and a part of the first bearing surface with the negative electrode connection terminal is positioned on the corresponding red light chip, the green light chip or the blue light chip.

8. The display screen of claim 1, wherein a driving circuit is integrated in the substrate, and the driving circuit is electrically connected to each of the positive electrode pad and the negative electrode pad.

9. The display screen of claim 1, wherein the positive electrode connection terminal is electrically connected to the positive electrode pad through a first gold wire, and the negative electrode connection terminal is electrically connected to corresponding red light chip, the green light chip or the blue light chip through a second gold wire.

10. The display screen of claim 1, wherein each of the plurality of carrier boards is a silicon wafer.

11. The display screen of claim 1, wherein the substrate is a circuit board.

12. A displaying device comprising:
    a display screen, comprising:
       a substrate, comprising a plurality of pad structures, the plurality of pad structures being arranged on a surface of the substrate in an array, each of the pad structures comprising a positive electrode pad and three negative electrode pads, wherein the three negative electrode pads are positioned on a side of the positive electrode pad and arranged side by side;

a plurality of LED chips, respectively arranged in a one-to-one correspondence with the pad structures, and each of the LED chips comprising a red light chip, a green light chip and a blue light chip, wherein positive electrodes of the red light chip, the green light chip, and the blue light chip correspond to the positive electrode pad, and negative electrodes of the red light chip, the green light chip, and the blue light chip correspond to the three negative electrode pads; and a plurality of carrier boards, respectively arranged corresponding to the red light chip, the green light chip and the blue light chip, each of the carrier boards comprising a positive electrode connection terminal and a negative electrode connection terminal, wherein the positive electrode connection terminal is electrically connected to the positive electrode pad, the negative electrode connection terminal is electrically connected to corresponding red light chip, the green light chip or the blue light chip; and a main body, connected to the display screen.

13. The displaying device of claim 12, wherein spaces between each of the negative electrode pads and each of the positive electrode pads are same.

14. The displaying device of claim 12, wherein the pad structures have at least one of a first structure, a second structure, a third structure, and a fourth structure, and a plurality of the negative electrode pads are respectively arranged on the first structure in a positive direction of X-axis of the positive electrode pad, a plurality of the negative electrode pads are respectively arranged on the second structure in a negative direction of the X-axis of the positive electrode pad, the third structure is a structure in which a plurality of the negative electrode pads are respectively arranged on the third structure in a positive direction of the Y-axis of the positive electrode pad, a plurality of the negative electrode pads are respectively arranged on the fourth structure in a negative direction of the Y axis of the positive electrode pad.

15. The displaying device of claim 14, wherein the carrier boards are arranged on corresponding red light chip, the green light chip or the blue light chip.

16. The displaying device of claim 14, wherein one of the plurality of carrier boards is arranged between the positive electrode pad and the corresponding red light chip, the green light chip or the blue light chip.

17. The displaying device of claim 14, wherein the carrier board comprises a first bearing surface and a second bearing surface opposite to each other, the positive electrode connection terminal and the negative electrode connection terminal are both positioned on the first bearing surface, and a first part of the second bearing surface is positioned on the positive electrode pad, a second part of the second bearing surface is positioned on the corresponding red light chip, the green light chip or the blue light chip.

18. The displaying device of claim 14, wherein the carrier board comprises a first bearing surface and a second bearing surface opposite to each other, the positive electrode connection terminal and the negative electrode connection terminal are both positioned on the first bearing surface, a part of the first bearing surface with the positive electrode connection terminal is positioned on the positive electrode pad, and a part of the first bearing surface with the negative electrode connection terminal is positioned on the corresponding red light chip, the green light chip or the blue light chip.

19. The displaying device of claim 12, wherein a driving circuit is integrated in the substrate, and the driving circuit is electrically connected to each of the positive electrode pad and the negative electrode pad.

20. The displaying device of claim 12, wherein the positive electrode connection terminal is electrically connected to the positive electrode pad through a first gold wire, and the negative electrode connection terminal is electrically connected to corresponding red light chip, the green light chip or the blue light chip through a second gold wire.

* * * * *